United States Patent
Cohen et al.

(10) Patent No.: US 10,931,062 B2
(45) Date of Patent: Feb. 23, 2021

(54) HIGH-FREQUENCY ELECTRICAL CONNECTOR

(71) Applicant: Amphenol Corporation, Wallingford, CT (US)

(72) Inventors: Thomas S. Cohen, New Boston, NH (US); Robert Richard, Nashua, NH (US); Eric Leo, Nashua, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/689,993

(22) Filed: Nov. 20, 2019

(65) Prior Publication Data

US 2020/0194940 A1   Jun. 18, 2020

Related U.S. Application Data

(60) Provisional application No. 62/770,462, filed on Nov. 21, 2018.

(51) Int. Cl.
*H01R 13/6585* (2011.01)
*H01R 13/6582* (2011.01)
(Continued)

(52) U.S. Cl.
CPC ....... *H01R 13/6585* (2013.01); *H01R 12/712* (2013.01); *H01R 12/724* (2013.01);
(Continued)

(58) Field of Classification Search
CPC ............ H01R 13/6582; H01R 13/6585; H01R 13/6587; H01R 13/6471; H01R 12/712;
(Continued)

(56) References Cited

U.S. PATENT DOCUMENTS

| 2,124,207 A | 7/1938 | Carl |
| 2,996,710 A | 8/1961 | Pratt |

(Continued)

FOREIGN PATENT DOCUMENTS

| CN | 2519434 Y | 10/2002 |
| CN | 1126212 C | 10/2003 |

(Continued)

OTHER PUBLICATIONS

Chinese Office Action for Application No. CN201580069567.7 dated Jun. 17, 2019.

(Continued)

*Primary Examiner* — Oscar C Jimenez
(74) *Attorney, Agent, or Firm* — Wolf, Greenfield & Sacks, P.C.

(57) ABSTRACT

An electrical connector comprises an insulative shell having a floor; a first plurality of contacts extending through the floor, wherein the first plurality of contacts are disposed in a plurality of columns; a second plurality of contacts extending through the floor, wherein the second plurality of contacts are interspersed with the first plurality of contacts within the plurality of columns; and a conductive member adjacent the floor. The conductive member comprises a first plurality of openings, wherein the first plurality of contacts extend through the openings of the first plurality of openings; a second plurality of openings, wherein the second plurality of contacts extend through the openings of the second plurality of openings; and a first plurality of tabs, extending into openings in the insulative shell.

15 Claims, 7 Drawing Sheets

(51) Int. Cl.
*H01R 12/72* (2011.01)
*H05K 1/14* (2006.01)
*H01R 12/71* (2011.01)
*H01R 13/6471* (2011.01)
*H01R 12/73* (2011.01)

(52) U.S. Cl.
CPC ....... *H01R 12/737* (2013.01); *H01R 13/6471* (2013.01); *H01R 13/6582* (2013.01); *H05K 1/14* (2013.01)

(58) Field of Classification Search
CPC .. H01R 12/724; H01R 12/737; H01R 13/514; H01R 13/516; H01R 13/72; H01R 12/727; H05K 1/14
See application file for complete search history.

(56) References Cited

U.S. PATENT DOCUMENTS

| | | |
|---|---|---|
| 3,002,162 A | 9/1961 | Garstang |
| 3,007,131 A | 10/1961 | Dahlgren et al. |
| 3,134,950 A | 5/1964 | Cook |
| 3,229,240 A | 1/1966 | Harrison et al. |
| 3,322,885 A | 5/1967 | May et al. |
| 3,594,613 A | 7/1971 | Prietula |
| 3,715,706 A | 2/1973 | Cook et al. |
| 3,786,372 A | 1/1974 | Epis et al. |
| 3,825,874 A | 7/1974 | Peverill |
| 3,863,181 A | 1/1975 | Glance et al. |
| 4,083,615 A | 4/1978 | Volinskie |
| 4,155,613 A | 5/1979 | Brandeau |
| 4,157,612 A | 6/1979 | Rainal |
| 4,195,272 A | 3/1980 | Boutros |
| 4,276,523 A | 6/1981 | Boutros et al. |
| 4,307,926 A | 12/1981 | Smith |
| 4,371,742 A | 2/1983 | Manly |
| 4,408,255 A | 10/1983 | Adkins |
| 4,447,105 A | 5/1984 | Ruehl |
| 4,471,015 A | 9/1984 | Ebneth et al. |
| 4,484,159 A | 11/1984 | Whitley |
| 4,490,283 A | 12/1984 | Kleiner |
| 4,518,651 A | 5/1985 | Wolfe, Jr. |
| 4,519,664 A | 5/1985 | Tillotson |
| 4,519,665 A | 5/1985 | Althouse et al. |
| 4,615,578 A | 10/1986 | Stadler et al. |
| 4,632,476 A | 12/1986 | Schell |
| 4,636,752 A | 1/1987 | Saito |
| 4,639,054 A | 1/1987 | Kersbergen |
| 4,682,129 A | 7/1987 | Bakermans et al. |
| 4,697,862 A | 10/1987 | Hasircoglu |
| 4,708,660 A | 11/1987 | Claeys et al. |
| 4,724,409 A | 2/1988 | Lehman |
| 4,728,762 A | 3/1988 | Roth et al. |
| 4,751,479 A | 6/1988 | Parr |
| 4,761,147 A | 8/1988 | Gauthier |
| 4,795,375 A | 1/1989 | Williams |
| 4,806,107 A | 2/1989 | Arnold et al. |
| 4,826,443 A | 5/1989 | Lockard |
| 4,846,724 A | 7/1989 | Sasaki et al. |
| 4,846,727 A | 7/1989 | Glover et al. |
| 4,871,316 A | 10/1989 | Herrell et al. |
| 4,878,155 A | 10/1989 | Conley |
| 4,889,500 A | 12/1989 | Lazar et al. |
| 4,913,667 A | 4/1990 | Muz |
| 4,924,179 A | 5/1990 | Sherman |
| 4,948,922 A | 8/1990 | Varadan et al. |
| 4,949,379 A | 8/1990 | Cordell |
| 4,970,354 A | 11/1990 | Iwasa et al. |
| 4,975,084 A | 12/1990 | Fedder et al. |
| 4,990,099 A | 2/1991 | Marin et al. |
| 4,992,060 A | 2/1991 | Meyer |
| 5,000,700 A | 3/1991 | Masubuchi et al. |
| 5,066,236 A | 11/1991 | Broeksteeg |
| 5,141,454 A | 8/1992 | Garrett et al. |
| 5,150,086 A | 9/1992 | Ito |
| 5,168,252 A | 12/1992 | Naito |
| 5,168,432 A | 12/1992 | Murphy et al. |
| 5,176,538 A | 1/1993 | Hansell, III et al. |
| 5,197,893 A | 3/1993 | Morlion et al. |
| 5,266,055 A | 11/1993 | Naito et al. |
| 5,280,257 A | 1/1994 | Cravens et al. |
| 5,287,076 A | 2/1994 | Johnescu et al. |
| 5,306,171 A | 4/1994 | Marshall |
| 5,332,979 A | 7/1994 | Roskewitsch et al. |
| 5,334,050 A | 8/1994 | Andrews |
| 5,340,334 A | 8/1994 | Nguyen |
| 5,346,410 A | 9/1994 | Moore, Jr. |
| 5,387,130 A | 2/1995 | Fedder et al. |
| 5,402,088 A | 3/1995 | Pierro et al. |
| 5,429,520 A | 7/1995 | Morlion et al. |
| 5,429,521 A | 7/1995 | Morlion et al. |
| 5,433,617 A | 7/1995 | Morlion et al. |
| 5,433,618 A | 7/1995 | Morlion et al. |
| 5,435,757 A | 7/1995 | Fedder et al. |
| 5,441,424 A | 8/1995 | Morlion et al. |
| 5,456,619 A | 10/1995 | Belopolsky et al. |
| 5,461,392 A | 10/1995 | Mott et al. |
| 5,484,310 A | 1/1996 | McNamara et al. |
| 5,487,673 A | 1/1996 | Hurtarte |
| 5,496,183 A | 3/1996 | Soes et al. |
| 5,499,935 A | 3/1996 | Powell |
| 5,509,827 A | 4/1996 | Huppenthal et al. |
| 5,551,893 A | 9/1996 | Johnson |
| 5,554,038 A | 9/1996 | Morlion et al. |
| 5,562,497 A | 10/1996 | Yagi et al. |
| 5,597,328 A | 1/1997 | Mouissie |
| 5,598,627 A | 2/1997 | Saka et al. |
| 5,632,634 A | 5/1997 | Soes |
| 5,651,702 A | 7/1997 | Hanning et al. |
| 5,669,789 A | 9/1997 | Law |
| 5,691,506 A | 11/1997 | Miyazaki et al. |
| 5,702,258 A | 12/1997 | Provencher et al. |
| 5,733,148 A | 3/1998 | Kaplan et al. |
| 5,743,765 A | 4/1998 | Andrews et al. |
| 5,781,759 A | 7/1998 | Kashiwabara |
| 5,796,323 A | 8/1998 | Uchikoba et al. |
| 5,831,491 A | 11/1998 | Buer et al. |
| 5,924,899 A | 7/1999 | Paagman |
| 5,981,869 A | 11/1999 | Kroger |
| 5,982,253 A | 11/1999 | Perrin et al. |
| 6,019,616 A | 2/2000 | Yagi et al. |
| 6,053,770 A | 4/2000 | Blom |
| 6,083,046 A | 7/2000 | Wu et al. |
| 6,095,825 A | 8/2000 | Liao |
| 6,095,872 A | 8/2000 | Lang et al. |
| 6,116,926 A | 9/2000 | Ortega et al. |
| 6,144,559 A | 11/2000 | Johnson et al. |
| 6,146,202 A | 11/2000 | Ramey et al. |
| 6,152,747 A | 11/2000 | McNamara |
| 6,168,466 B1 | 1/2001 | Chiou |
| 6,168,469 B1 | 1/2001 | Lu |
| 6,174,203 B1 | 1/2001 | Asao |
| 6,174,944 B1 | 1/2001 | Chiba et al. |
| 6,203,376 B1 | 3/2001 | Magajne et al. |
| 6,217,372 B1 | 4/2001 | Reed |
| 6,273,753 B1 | 8/2001 | Ko |
| 6,273,758 B1 | 8/2001 | Lloyd et al. |
| 6,285,542 B1 | 9/2001 | Kennedy, III et al. |
| 6,293,827 B1 | 9/2001 | Stokoe |
| 6,299,438 B1 | 10/2001 | Sahagian et al. |
| 6,299,483 B1 | 10/2001 | Cohen et al. |
| 6,322,379 B1 | 11/2001 | Ortega et al. |
| 6,328,601 B1 | 12/2001 | Yip et al. |
| 6,347,962 B1 | 2/2002 | Kline |
| 6,350,134 B1 | 2/2002 | Fogg et al. |
| 6,364,711 B1 | 4/2002 | Berg et al. |
| 6,364,718 B1 | 4/2002 | Polgar et al. |
| 6,366,471 B1 | 4/2002 | Edwards et al. |
| 6,371,788 B1 | 4/2002 | Bowling et al. |
| 6,375,510 B2 | 4/2002 | Asao |
| 6,379,188 B1 | 4/2002 | Cohen et al. |
| 6,398,588 B1 | 6/2002 | Bickford |
| 6,409,543 B1 | 6/2002 | Astbury, Jr. et al. |

(56) References Cited

U.S. PATENT DOCUMENTS

| | | |
|---|---|---|
| 6,452,789 B1 | 9/2002 | Pallotti et al. |
| 6,482,017 B1 | 11/2002 | Van Doorn |
| 6,489,563 B1 | 12/2002 | Zhao et al. |
| 6,503,103 B1 | 1/2003 | Cohen et al. |
| 6,506,076 B2 | 1/2003 | Cohen et al. |
| 6,517,360 B1 | 2/2003 | Cohen |
| 6,530,790 B1 | 3/2003 | McNamara et al. |
| 6,535,367 B1 | 3/2003 | Carpenter et al. |
| 6,537,086 B1 | 3/2003 | Mac Mullin |
| 6,537,087 B2 | 3/2003 | McNamara et al. |
| 6,551,140 B2 | 4/2003 | Billman et al. |
| 6,554,647 B1 | 4/2003 | Cohen et al. |
| 6,565,387 B2 | 5/2003 | Cohen |
| 6,574,115 B2 | 6/2003 | Asano et al. |
| 6,575,772 B1 | 6/2003 | Soubh et al. |
| 6,579,116 B2 | 6/2003 | Brennan et al. |
| 6,582,244 B2 | 6/2003 | Fogg et al. |
| 6,592,390 B1 | 7/2003 | Davis et al. |
| 6,592,401 B1 | 7/2003 | Gardnet et al. |
| 6,595,802 B1 | 7/2003 | Watanabe et al. |
| 6,602,095 B2 | 8/2003 | Astbury, Jr. et al. |
| 6,607,402 B2 | 8/2003 | Cohen et al. |
| 6,616,864 B1 | 9/2003 | Jiang et al. |
| 6,652,296 B2 | 11/2003 | Kuroda et al. |
| 6,652,318 B1 | 11/2003 | Winings et al. |
| 6,655,966 B2 | 12/2003 | Rothermel et al. |
| 6,685,501 B1 | 2/2004 | Wu et al. |
| 6,692,262 B1 | 2/2004 | Loveless |
| 6,705,893 B1 | 3/2004 | Ko |
| 6,709,294 B1 | 3/2004 | Cohen et al. |
| 6,713,672 B1 | 3/2004 | Stickney |
| 6,743,057 B2 | 6/2004 | Davis et al. |
| 6,776,659 B1 | 8/2004 | Stokoe et al. |
| 6,786,771 B2 | 9/2004 | Gailus |
| 6,797,891 B1 | 9/2004 | Blair et al. |
| 6,814,619 B1 | 11/2004 | Stokoe et al. |
| 6,824,426 B1 | 11/2004 | Spink, Jr. |
| 6,830,489 B2 | 12/2004 | Aoyama |
| 6,843,657 B2 | 1/2005 | Driscoll et al. |
| 6,872,085 B1 | 3/2005 | Cohen et al. |
| 6,903,934 B2 | 6/2005 | Lo et al. |
| 6,916,183 B2 | 7/2005 | Alger et al. |
| 6,932,649 B1 | 8/2005 | Rothermel et al. |
| 6,955,565 B2 | 10/2005 | Lloyd et al. |
| 6,971,887 B1 | 12/2005 | Trobough |
| 6,979,226 B2 | 12/2005 | Otsu et al. |
| 7,044,794 B2 | 5/2006 | Consoli et al. |
| 7,056,128 B2 | 6/2006 | Driscoll et al. |
| 7,057,570 B2 | 6/2006 | Irion, II et al. |
| 7,070,446 B2 | 7/2006 | Henry et al. |
| 7,074,086 B2 | 7/2006 | Cohen et al. |
| 7,077,658 B1 | 7/2006 | Ashman et al. |
| 7,094,102 B2 | 8/2006 | Cohen et al. |
| 7,108,556 B2 | 9/2006 | Cohen et al. |
| 7,148,428 B2 | 12/2006 | Meier et al. |
| 7,163,421 B1 | 1/2007 | Cohen et al. |
| 7,214,097 B1 | 5/2007 | Hsu et al. |
| 7,223,915 B2 | 5/2007 | Hackman |
| 7,234,944 B2 | 6/2007 | Nordin et al. |
| 7,244,137 B2 | 7/2007 | Renfro et al. |
| 7,267,515 B2 | 9/2007 | Lappöhn |
| 7,280,372 B2 | 10/2007 | Grundy et al. |
| 7,285,018 B2 | 10/2007 | Kenny et al. |
| 7,307,293 B2 | 12/2007 | Fjelstad et al. |
| 7,331,816 B2 | 2/2008 | Krohn et al. |
| 7,331,830 B2 | 2/2008 | Minich |
| 7,335,063 B2 | 2/2008 | Cohen et al. |
| 7,354,274 B2 | 4/2008 | Minich |
| 7,371,117 B2 | 5/2008 | Gailus |
| 7,384,275 B2 | 6/2008 | Ngo |
| 7,402,048 B2 | 7/2008 | Meier et al. |
| 7,422,483 B2 | 9/2008 | Avery et al. |
| 7,431,608 B2 | 10/2008 | Sakaguchi et al. |
| 7,445,471 B1 | 11/2008 | Scherer et al. |
| 7,462,942 B2 | 12/2008 | Tan et al. |
| 7,485,012 B2 | 2/2009 | Daugherty et al. |
| 7,494,383 B2 | 2/2009 | Cohen et al. |
| 7,534,142 B2 | 5/2009 | Avery et al. |
| 7,540,781 B2 | 6/2009 | Kenny et al. |
| 7,549,897 B2 | 6/2009 | Fedder et al. |
| 7,581,990 B2 | 9/2009 | Kirk et al. |
| 7,588,464 B2 | 9/2009 | Kim |
| 7,613,011 B2 | 11/2009 | Grundy et al. |
| 7,621,779 B2 | 11/2009 | Laurx et al. |
| 7,652,381 B2 | 1/2010 | Grundy et al. |
| 7,654,831 B1 | 2/2010 | Wu |
| 7,658,654 B2 | 2/2010 | Ohyama et al. |
| 7,686,659 B2 | 3/2010 | Peng |
| 7,690,930 B2 | 4/2010 | Chen et al. |
| 7,713,077 B1 | 5/2010 | McGowan et al. |
| 7,719,843 B2 | 5/2010 | Dunham |
| 7,722,401 B2 | 5/2010 | Kirk et al. |
| 7,731,537 B2 | 6/2010 | Amleshi et al. |
| 7,744,414 B2 | 6/2010 | Scherer et al. |
| 7,753,731 B2 | 7/2010 | Cohen et al. |
| 7,771,233 B2 | 8/2010 | Gailus |
| 7,775,802 B2 | 8/2010 | Defibaugh et al. |
| 7,789,676 B2 | 9/2010 | Morgan et al. |
| 7,794,240 B2 | 9/2010 | Cohen et al. |
| 7,794,278 B2 | 9/2010 | Cohen et al. |
| 7,811,129 B2 | 10/2010 | Glover et al. |
| 7,819,675 B2 | 10/2010 | Ko et al. |
| 7,824,197 B1 | 11/2010 | Westman et al. |
| 7,857,630 B2 | 12/2010 | Hermant et al. |
| 7,862,344 B2 | 1/2011 | Morgan et al. |
| 7,871,296 B2 | 1/2011 | Fowler et al. |
| 7,874,873 B2 | 1/2011 | Do et al. |
| 7,887,371 B2 | 2/2011 | Kenny et al. |
| 7,906,730 B2 | 3/2011 | Atkinson et al. |
| 7,914,304 B2 | 3/2011 | Cartier et al. |
| 7,967,637 B2 | 6/2011 | Fedder et al. |
| 7,976,318 B2 | 7/2011 | Fedder et al. |
| 7,985,097 B2 | 7/2011 | Gulla |
| 8,002,581 B1 | 8/2011 | Whiteman, Jr. et al. |
| 8,016,616 B2 | 9/2011 | Glover et al. |
| 8,018,733 B2 | 9/2011 | Jia |
| 8,036,500 B2 | 10/2011 | McColloch |
| 8,057,267 B2 | 11/2011 | Johnescu |
| 8,083,553 B2 | 12/2011 | Manter et al. |
| 8,100,699 B1 | 1/2012 | Costello |
| 8,157,573 B2 | 4/2012 | Tanaka |
| 8,162,675 B2 | 4/2012 | Regnier et al. |
| 8,167,651 B2 | 5/2012 | Glover et al. |
| 8,182,289 B2 | 5/2012 | Stokoe et al. |
| 8,192,222 B2 | 6/2012 | Kameyama |
| 8,197,285 B2 | 6/2012 | Farmer |
| 8,210,877 B2 | 7/2012 | Droesbeke |
| 8,215,968 B2 | 7/2012 | Cartier et al. |
| 8,226,441 B2 | 7/2012 | Regnier et al. |
| 8,251,745 B2 | 8/2012 | Johnescu et al. |
| 8,272,877 B2 | 9/2012 | Stokoe et al. |
| 8,308,491 B2 | 11/2012 | Nichols et al. |
| 8,308,512 B2 | 11/2012 | Ritter et al. |
| 8,337,243 B2 | 12/2012 | Elkhatib et al. |
| 8,338,713 B2 | 12/2012 | Fjelstad et al. |
| 8,371,875 B2 | 2/2013 | Gailus |
| 8,371,876 B2 | 2/2013 | Davis |
| 8,382,524 B2 | 2/2013 | Khilchenko et al. |
| 8,398,433 B1 | 3/2013 | Yang |
| 8,419,472 B1 | 4/2013 | Swanger et al. |
| 8,439,704 B2 | 5/2013 | Reed |
| 8,449,312 B2 | 5/2013 | Lang et al. |
| 8,449,330 B1 | 5/2013 | Schroll et al. |
| 8,465,302 B2 | 6/2013 | Regnier et al. |
| 8,469,745 B2 | 6/2013 | Davis et al. |
| 8,475,209 B1 | 7/2013 | Whiteman, Jr. et al. |
| 8,535,065 B2 | 9/2013 | Costello et al. |
| 8,540,525 B2 | 9/2013 | Regnier et al. |
| 8,550,861 B2 | 10/2013 | Cohen et al. |
| 8,553,102 B2 | 10/2013 | Yamada |
| 8,556,657 B1 | 10/2013 | Nichols |
| 8,588,561 B2 | 11/2013 | Zbinden et al. |
| 8,588,562 B2 | 11/2013 | Zbinden et al. |
| 8,597,055 B2 | 12/2013 | Regnier et al. |

(56) References Cited

U.S. PATENT DOCUMENTS

| | | |
|---|---|---|
| 8,657,627 B2 | 2/2014 | McNamara et al. |
| 8,662,924 B2 | 3/2014 | Davis et al. |
| 8,672,707 B2 | 3/2014 | Nichols et al. |
| 8,678,860 B2 | 3/2014 | Minich et al. |
| 8,690,604 B2 | 4/2014 | Davis |
| 8,715,003 B2 | 5/2014 | Buck et al. |
| 8,740,644 B2 | 6/2014 | Long |
| 8,753,145 B2 | 6/2014 | Lang et al. |
| 8,758,051 B2 | 6/2014 | Nonen et al. |
| 8,771,016 B2 | 7/2014 | Atkinson et al. |
| 8,787,711 B2 | 7/2014 | Zbinden et al. |
| 8,804,342 B2 | 8/2014 | Behziz et al. |
| 8,814,595 B2 | 8/2014 | Cohen et al. |
| 8,845,364 B2 | 9/2014 | Wanha et al. |
| 8,864,521 B2 | 10/2014 | Atkinson et al. |
| 8,888,531 B2 | 11/2014 | Jeon |
| 8,888,533 B2 | 11/2014 | Westman et al. |
| 8,911,255 B2 | 12/2014 | Scherer et al. |
| 8,926,377 B2 | 1/2015 | Kirk et al. |
| 8,944,831 B2 | 2/2015 | Stoner et al. |
| 8,992,236 B2 | 3/2015 | Wittig et al. |
| 8,992,237 B2 | 3/2015 | Regnier et al. |
| 8,998,642 B2 | 4/2015 | Manter et al. |
| 9,004,942 B2 | 4/2015 | Paniauqa |
| 9,011,177 B2 | 4/2015 | Lloyd et al. |
| 9,022,806 B2 | 5/2015 | Girard, Jr. et al. |
| 9,028,201 B2 | 5/2015 | Kirk et al. |
| 9,028,281 B2 | 5/2015 | Kirk et al. |
| 9,035,183 B2 | 5/2015 | Kodama et al. |
| 9,040,824 B2 | 5/2015 | Guetig et al. |
| 9,071,001 B2 | 6/2015 | Scherer et al. |
| 9,118,151 B2 | 8/2015 | Tran et al. |
| 9,119,292 B2 | 8/2015 | Gundel |
| 9,124,009 B2 | 9/2015 | Atkinson et al. |
| 9,142,896 B2 * | 9/2015 | Wickes .............. H01R 13/6397 |
| 9,142,921 B2 | 9/2015 | Wanha et al. |
| 9,203,171 B2 | 12/2015 | Yu et al. |
| 9,214,768 B2 | 12/2015 | Pao et al. |
| 9,219,335 B2 | 12/2015 | Atkinson et al. |
| 9,225,085 B2 | 12/2015 | Cartier, Jr. et al. |
| 9,232,676 B2 | 1/2016 | Sechrist et al. |
| 9,246,251 B2 | 1/2016 | Regnier et al. |
| 9,257,794 B2 | 2/2016 | Wanha et al. |
| 9,312,618 B2 | 4/2016 | Regnier et al. |
| 9,350,108 B2 | 5/2016 | Long |
| 9,356,401 B1 | 5/2016 | Horning et al. |
| 9,362,678 B2 | 6/2016 | Wanha et al. |
| 9,373,917 B2 | 6/2016 | Sypolt et al. |
| 9,374,165 B2 | 6/2016 | Zbinden et al. |
| 9,385,455 B2 | 7/2016 | Regnier et al. |
| 9,391,407 B1 | 7/2016 | Bucher et al. |
| 9,413,112 B2 | 8/2016 | Helster et al. |
| 9,450,344 B2 | 9/2016 | Cartier, Jr. et al. |
| 9,490,558 B2 | 11/2016 | Wanha et al. |
| 9,509,101 B2 | 11/2016 | Cartier et al. |
| 9,520,689 B2 | 12/2016 | Cartier, Jr. et al. |
| 9,531,133 B1 | 12/2016 | Horning et al. |
| 9,553,381 B2 | 1/2017 | Regnier |
| 9,559,446 B1 | 1/2017 | Wetzel et al. |
| 9,564,696 B2 | 2/2017 | Gulla |
| 9,608,348 B2 | 3/2017 | Wanha et al. |
| 9,651,752 B2 | 5/2017 | Zbinden et al. |
| 9,660,364 B2 | 5/2017 | Wig et al. |
| 9,666,961 B2 | 5/2017 | Horning et al. |
| 9,685,736 B2 * | 6/2017 | Gailus ................. H01R 13/6461 |
| 9,728,903 B2 * | 8/2017 | Long ..................... H01R 12/724 |
| 9,774,144 B2 | 9/2017 | Cartier, Jr. et al. |
| 9,801,301 B1 | 10/2017 | Costello |
| 9,841,572 B2 | 12/2017 | Zbinden et al. |
| 9,843,135 B2 | 12/2017 | Guetig et al. |
| 9,876,319 B2 | 1/2018 | Zhao et al. |
| 9,929,512 B1 | 3/2018 | Trout et al. |
| 9,985,367 B2 | 5/2018 | Wanha et al. |
| 9,985,389 B1 | 5/2018 | Morgan et al. |
| 10,056,706 B2 | 8/2018 | Wanha et al. |
| 10,062,984 B2 | 8/2018 | Regnier |
| 10,069,225 B2 | 9/2018 | Wanha et al. |
| 10,096,945 B2 | 10/2018 | Cartier, Jr. et al. |
| 10,170,869 B2 | 1/2019 | Gailus et al. |
| 10,181,663 B2 | 1/2019 | Regnier |
| 10,205,286 B2 | 2/2019 | Provencher et al. |
| RE47,342 E | 4/2019 | Lloyd et al. |
| 10,283,914 B1 * | 5/2019 | Morgan ............. H01R 13/6588 |
| 10,305,224 B2 | 5/2019 | Girard |
| 10,651,603 B2 * | 5/2020 | Kurudamannil ... H01R 13/6471 |
| 10,720,735 B2 | 7/2020 | Provencher et al. |
| 2001/0012730 A1 | 8/2001 | Ramey et al. |
| 2001/0042632 A1 | 11/2001 | Manov et al. |
| 2001/0046810 A1 | 11/2001 | Cohen et al. |
| 2002/0042223 A1 | 4/2002 | Belopolsky et al. |
| 2002/0088628 A1 | 7/2002 | Chen |
| 2002/0089464 A1 | 7/2002 | Joshi |
| 2002/0098738 A1 | 7/2002 | Astbury et al. |
| 2002/0111068 A1 | 8/2002 | Cohen et al. |
| 2002/0111069 A1 | 8/2002 | Astbury et al. |
| 2002/0157865 A1 | 10/2002 | Noda |
| 2002/0187688 A1 | 12/2002 | Edwards et al. |
| 2003/0073331 A1 | 4/2003 | Peloza et al. |
| 2003/0119362 A1 | 6/2003 | Nelson et al. |
| 2004/0005815 A1 | 1/2004 | Mizumura et al. |
| 2004/0018757 A1 | 1/2004 | Lang et al. |
| 2004/0020674 A1 | 2/2004 | McFadden et al. |
| 2004/0094328 A1 | 5/2004 | Fjelstad et al. |
| 2004/0110421 A1 | 6/2004 | Broman et al. |
| 2004/0115968 A1 | 6/2004 | Cohen |
| 2004/0121633 A1 | 6/2004 | David et al. |
| 2004/0121652 A1 | 6/2004 | Gailus |
| 2004/0155328 A1 | 8/2004 | Kline |
| 2004/0196112 A1 | 10/2004 | Welbon et al. |
| 2004/0224559 A1 | 11/2004 | Nelson et al. |
| 2004/0229510 A1 | 11/2004 | Lloyd et al. |
| 2004/0259419 A1 | 12/2004 | Payne et al. |
| 2004/0264894 A1 | 12/2004 | Cooke et al. |
| 2005/0006126 A1 | 1/2005 | Aisenbrey |
| 2005/0032430 A1 | 2/2005 | Otsu et al. |
| 2005/0070160 A1 | 3/2005 | Cohen et al. |
| 2005/0093127 A1 | 5/2005 | Fjelstad et al. |
| 2005/0118869 A1 | 6/2005 | Evans |
| 2005/0133245 A1 | 6/2005 | Katsuyama et al. |
| 2005/0142944 A1 | 6/2005 | Ling et al. |
| 2005/0176835 A1 | 8/2005 | Kobayashi et al. |
| 2005/0233610 A1 | 10/2005 | Tutt et al. |
| 2005/0239339 A1 | 10/2005 | Pepe |
| 2005/0283974 A1 | 12/2005 | Richard et al. |
| 2005/0287869 A1 | 12/2005 | Kenny et al. |
| 2006/0001163 A1 | 1/2006 | Kolbehdari et al. |
| 2006/0068640 A1 | 3/2006 | Gailus |
| 2006/0079119 A1 | 4/2006 | Wu |
| 2006/0091507 A1 | 5/2006 | Fjelstad et al. |
| 2006/0216969 A1 | 9/2006 | Bright et al. |
| 2006/0228922 A1 | 10/2006 | Morriss |
| 2007/0004282 A1 | 1/2007 | Cohen et al. |
| 2007/0021001 A1 | 1/2007 | Laurx et al. |
| 2007/0021002 A1 | 1/2007 | Laurx et al. |
| 2007/0032104 A1 | 2/2007 | Yamada et al. |
| 2007/0037419 A1 | 2/2007 | Sparrowhawk |
| 2007/0042639 A1 | 2/2007 | Manter et al. |
| 2007/0054554 A1 | 3/2007 | Do et al. |
| 2007/0059961 A1 | 3/2007 | Cartier et al. |
| 2007/0155241 A1 | 7/2007 | Lappöhn |
| 2007/0197095 A1 | 8/2007 | Feldman et al. |
| 2007/0207641 A1 | 9/2007 | Minich |
| 2007/0218765 A1 | 9/2007 | Cohen et al. |
| 2007/0243741 A1 | 10/2007 | Yang |
| 2007/0254517 A1 | 11/2007 | Olson et al. |
| 2008/0026638 A1 | 1/2008 | Cohen et al. |
| 2008/0194146 A1 | 8/2008 | Gailus |
| 2008/0200955 A1 | 8/2008 | Tepic |
| 2008/0207023 A1 | 8/2008 | Tuin et al. |
| 2008/0246555 A1 | 10/2008 | Kirk et al. |
| 2008/0248658 A1 | 10/2008 | Cohen et al. |
| 2008/0248659 A1 | 10/2008 | Cohen et al. |
| 2008/0248660 A1 | 10/2008 | Kirk et al. |
| 2008/0264673 A1 | 10/2008 | Chi et al. |

(56) References Cited

U.S. PATENT DOCUMENTS

| | | |
|---|---|---|
| 2008/0267620 A1 | 10/2008 | Cole et al. |
| 2008/0297988 A1 | 12/2008 | Chau |
| 2008/0305689 A1 | 12/2008 | Zhang et al. |
| 2009/0011641 A1 | 1/2009 | Cohen et al. |
| 2009/0011645 A1 | 1/2009 | Laurx et al. |
| 2009/0011664 A1 | 1/2009 | Laurx et al. |
| 2009/0017682 A1 | 1/2009 | Amleshi et al. |
| 2009/0023330 A1 | 1/2009 | Stoner et al. |
| 2009/0051558 A1 | 2/2009 | Dorval |
| 2009/0098767 A1 | 4/2009 | Long |
| 2009/0117386 A1 | 5/2009 | Vacanti et al. |
| 2009/0130913 A1 | 5/2009 | Yi et al. |
| 2009/0130918 A1 | 5/2009 | Nguyen et al. |
| 2009/0166082 A1 | 7/2009 | Liu et al. |
| 2009/0176400 A1 | 7/2009 | Davis et al. |
| 2009/0205194 A1 | 8/2009 | Semba et al. |
| 2009/0215309 A1 | 8/2009 | Mongold et al. |
| 2009/0227141 A1 | 9/2009 | Pan |
| 2009/0239395 A1 | 9/2009 | Cohen et al. |
| 2009/0247012 A1 | 10/2009 | Pan |
| 2009/0291593 A1 | 11/2009 | Atkinson et al. |
| 2009/0305533 A1 | 12/2009 | Feldman et al. |
| 2009/0311908 A1 | 12/2009 | Fogg et al. |
| 2010/0009571 A1 | 1/2010 | Scherer et al. |
| 2010/0081302 A1 | 4/2010 | Atkinson et al. |
| 2010/0099299 A1 | 4/2010 | Moriyama et al. |
| 2010/0112850 A1 | 5/2010 | Rao et al. |
| 2010/0144167 A1 | 6/2010 | Fedder et al. |
| 2010/0144168 A1 | 6/2010 | Glover et al. |
| 2010/0144175 A1 | 6/2010 | Helster et al. |
| 2010/0144201 A1 | 6/2010 | Defibaugh et al. |
| 2010/0144203 A1 | 6/2010 | Glover et al. |
| 2010/0144204 A1 | 6/2010 | Knaub et al. |
| 2010/0177489 A1 | 7/2010 | Yagisawa |
| 2010/0183141 A1 | 7/2010 | Arai et al. |
| 2010/0203768 A1 | 8/2010 | Kondo et al. |
| 2010/0221951 A1 | 9/2010 | Pepe et al. |
| 2010/0291806 A1 | 11/2010 | Minich et al. |
| 2010/0294530 A1 | 11/2010 | Atkinson et al. |
| 2011/0003509 A1 | 1/2011 | Gailus |
| 2011/0074213 A1 | 3/2011 | Schaffer et al. |
| 2011/0104948 A1 | 5/2011 | Girard, Jr. et al. |
| 2011/0130038 A1 | 6/2011 | Cohen et al. |
| 2011/0177699 A1 | 7/2011 | Crofoot et al. |
| 2011/0212632 A1 | 9/2011 | Stoke et al. |
| 2011/0212633 A1 | 9/2011 | Regnier et al. |
| 2011/0212649 A1 | 9/2011 | Stokoe et al. |
| 2011/0212650 A1 | 9/2011 | Amleshi et al. |
| 2011/0223807 A1 | 9/2011 | Jeon et al. |
| 2011/0230095 A1 | 9/2011 | Atkinson et al. |
| 2011/0230096 A1 | 9/2011 | Atkinson et al. |
| 2011/0230104 A1 | 9/2011 | Lang et al. |
| 2011/0263156 A1 | 10/2011 | Ko |
| 2011/0287663 A1 | 11/2011 | Gailus et al. |
| 2011/0300757 A1 | 12/2011 | Regnier et al. |
| 2012/0003848 A1 | 1/2012 | Casher et al. |
| 2012/0034820 A1 | 2/2012 | Lang et al. |
| 2012/0077369 A1 | 3/2012 | Andersen |
| 2012/0077380 A1 | 3/2012 | Minich et al. |
| 2012/0094536 A1 | 4/2012 | Khilchenko et al. |
| 2012/0135643 A1 | 5/2012 | Lange et al. |
| 2012/0156929 A1 | 6/2012 | Manter et al. |
| 2012/0184136 A1 | 7/2012 | Ritter |
| 2012/0202363 A1 | 8/2012 | McNamara et al. |
| 2012/0202386 A1 | 8/2012 | McNamara et al. |
| 2012/0214344 A1 | 8/2012 | Cohen et al. |
| 2012/0329294 A1 | 12/2012 | Raybold et al. |
| 2013/0012038 A1 | 1/2013 | Kirk et al. |
| 2013/0017715 A1 | 1/2013 | Laarhoven et al. |
| 2013/0017733 A1 | 1/2013 | Kirk et al. |
| 2013/0078870 A1 | 3/2013 | Milbrand, Jr. |
| 2013/0089993 A1* | 4/2013 | Jeon ................. H01R 13/6582 439/92 |
| 2013/0092429 A1 | 4/2013 | Ellison |
| 2013/0109232 A1 | 5/2013 | Paniagua |
| 2013/0143442 A1 | 6/2013 | Cohen et al. |
| 2013/0178107 A1 | 7/2013 | Costello et al. |
| 2013/0196553 A1 | 8/2013 | Gailus |
| 2013/0210246 A1 | 8/2013 | Davis et al. |
| 2013/0223036 A1 | 8/2013 | Herring et al. |
| 2013/0225006 A1 | 8/2013 | Khilchenko et al. |
| 2013/0273781 A1 | 10/2013 | Buck et al. |
| 2013/0288521 A1 | 10/2013 | McClellan et al. |
| 2013/0288525 A1 | 10/2013 | McClellan et al. |
| 2013/0288539 A1 | 10/2013 | McClellan et al. |
| 2013/0340251 A1 | 12/2013 | Regnier et al. |
| 2014/0004724 A1 | 1/2014 | Cartier, Jr. et al. |
| 2014/0004726 A1 | 1/2014 | Cartier, Jr. et al. |
| 2014/0004746 A1 | 1/2014 | Cartier, Jr. et al. |
| 2014/0041937 A1 | 2/2014 | Lloyd et al. |
| 2014/0057493 A1 | 2/2014 | De Geest et al. |
| 2014/0057494 A1 | 2/2014 | Cohen |
| 2014/0057498 A1 | 2/2014 | Cohen |
| 2014/0065883 A1 | 3/2014 | Cohen et al. |
| 2014/0073174 A1 | 3/2014 | Yang |
| 2014/0073181 A1 | 3/2014 | Yang |
| 2014/0080331 A1 | 3/2014 | Jeon |
| 2014/0194004 A1 | 7/2014 | Pickel et al. |
| 2014/0242844 A1 | 8/2014 | Wanha et al. |
| 2014/0273551 A1 | 9/2014 | Resendez et al. |
| 2014/0273557 A1 | 9/2014 | Cartier, Jr. et al. |
| 2014/0273627 A1 | 9/2014 | Cartier, Jr. et al. |
| 2014/0287627 A1 | 9/2014 | Cohen |
| 2014/0308852 A1 | 10/2014 | Gulla |
| 2014/0322974 A1 | 10/2014 | Chang et al. |
| 2014/0335707 A1 | 11/2014 | Johnescu et al. |
| 2014/0335736 A1 | 11/2014 | Regnier et al. |
| 2015/0031238 A1 | 1/2015 | Davis et al. |
| 2015/0056856 A1 | 2/2015 | Atkinson et al. |
| 2015/0079829 A1 | 3/2015 | Brodsgaard |
| 2015/0079845 A1 | 3/2015 | Wanha et al. |
| 2015/0180578 A1 | 6/2015 | Leigh et al. |
| 2015/0194751 A1 | 7/2015 | Herring |
| 2015/0200496 A1 | 7/2015 | Simpson et al. |
| 2015/0207247 A1 | 7/2015 | Regnier et al. |
| 2015/0236450 A1 | 8/2015 | Davis |
| 2015/0236451 A1 | 8/2015 | Cartier, Jr. et al. |
| 2015/0236452 A1 | 8/2015 | Cartier, Jr. et al. |
| 2015/0255926 A1 | 9/2015 | Paniagua |
| 2015/0280351 A1 | 10/2015 | Bertsch |
| 2015/0303608 A1 | 10/2015 | Zerebilov et al. |
| 2015/0357736 A1 | 12/2015 | Tran et al. |
| 2015/0357761 A1 | 12/2015 | Wanha et al. |
| 2016/0013594 A1 | 1/2016 | Costello et al. |
| 2016/0013596 A1 | 1/2016 | Regnier |
| 2016/0028189 A1 | 1/2016 | Resendez et al. |
| 2016/0104956 A1 | 4/2016 | Santos et al. |
| 2016/0111825 A1 | 4/2016 | Wanha et al. |
| 2016/0141807 A1 | 5/2016 | Gailus et al. |
| 2016/0149343 A1 | 5/2016 | Atkinson et al. |
| 2016/0149362 A1 | 5/2016 | Ritter et al. |
| 2016/0150633 A1 | 5/2016 | Cartier, Jr. |
| 2016/0150639 A1 | 5/2016 | Gailus et al. |
| 2016/0150645 A1 | 5/2016 | Gailus et al. |
| 2016/0181713 A1 | 6/2016 | Peloza et al. |
| 2016/0181732 A1 | 6/2016 | Laurx et al. |
| 2016/0190747 A1 | 6/2016 | Regnier et al. |
| 2016/0197423 A1 | 7/2016 | Regnier |
| 2016/0218455 A1 | 7/2016 | Sayre et al. |
| 2016/0233598 A1 | 8/2016 | Wittig |
| 2016/0268714 A1 | 9/2016 | Wanha et al. |
| 2016/0274316 A1 | 9/2016 | Verdiell |
| 2016/0308296 A1 | 10/2016 | Pitten et al. |
| 2016/0322770 A1 | 11/2016 | Zerebilov |
| 2016/0344141 A1 | 11/2016 | Cartier et al. |
| 2017/0025783 A1 | 1/2017 | Astbury et al. |
| 2017/0033478 A1 | 2/2017 | Wanha et al. |
| 2017/0042070 A1 | 2/2017 | Baumler et al. |
| 2017/0047692 A1 | 2/2017 | Cartier et al. |
| 2017/0077643 A1 | 3/2017 | Zbinden et al. |
| 2017/0093093 A1 | 3/2017 | Cartier, Jr. et al. |
| 2017/0098901 A1 | 4/2017 | Regnier |
| 2017/0162960 A1 | 6/2017 | Wanha et al. |
| 2017/0294743 A1 | 10/2017 | Gailus et al. |

(56) References Cited

U.S. PATENT DOCUMENTS

| | | |
|---|---|---|
| 2017/0302011 A1 | 10/2017 | Wanha et al. |
| 2017/0338595 A1 | 11/2017 | Girard, Jr. |
| 2017/0365942 A1 | 12/2017 | Regnier |
| 2017/0365943 A1 | 12/2017 | Wanha et al. |
| 2018/0006416 A1 | 1/2018 | Lloyd et al. |
| 2018/0034175 A1 | 2/2018 | Lloyd et al. |
| 2018/0034190 A1 | 2/2018 | Ngo |
| 2018/0040989 A1 | 2/2018 | Chen |
| 2018/0109043 A1 | 4/2018 | Provencher et al. |
| 2018/0145438 A1 | 5/2018 | Cohen |
| 2018/0219331 A1 | 8/2018 | Cartier, Jr. et al. |
| 2018/0219332 A1 | 8/2018 | Brungard et al. |
| 2018/0366880 A1 | 12/2018 | Zerebilov et al. |
| 2019/0013625 A1 | 1/2019 | Gailus et al. |
| 2019/0020155 A1 | 1/2019 | Trout et al. |
| 2019/0044284 A1 | 2/2019 | Dunham |
| 2019/0157812 A1 | 5/2019 | Gailus et al. |
| 2019/0173236 A1 | 6/2019 | Provencher et al. |
| 2019/0296469 A1 | 9/2019 | Stokoe et al. |
| 2020/0303879 A1 | 9/2020 | Provencher et al. |

FOREIGN PATENT DOCUMENTS

| | | |
|---|---|---|
| CN | 1127783 C | 11/2003 |
| CN | 101164204 A | 4/2008 |
| CN | 101312275 A | 11/2008 |
| CN | 101752700 A | 6/2010 |
| CN | 201562814 U | 8/2010 |
| CN | 101854748 A | 10/2010 |
| CN | 102157860 A | 8/2011 |
| CN | 201966361 U | 9/2011 |
| CN | 102299429 U | 12/2011 |
| CN | 102598430 A | 7/2012 |
| CN | 202678544 U | 1/2013 |
| CN | 103151651 A | 6/2013 |
| CN | 103915727 A | 7/2014 |
| CN | 104241973 A | 12/2014 |
| DE | 3447556 A1 | 7/1986 |
| EP | 1 207 587 A2 | 5/2002 |
| EP | 1 779 472 A1 | 5/2007 |
| EP | 2 169 770 A2 | 3/2010 |
| EP | 2 811 589 A1 | 12/2014 |
| GB | 1272347 A | 4/1972 |
| JP | 02-079571 U | 6/1990 |
| JP | 7302649 A2 | 11/1995 |
| JP | 2000-311749 A2 | 11/2000 |
| JP | 2006-108115 A2 | 4/2006 |
| JP | 2011-018651 A | 1/2011 |
| JP | 2012-516021 A | 7/2012 |
| JP | 2016-528688 A | 9/2016 |
| TW | M357771 U | 5/2009 |
| WO | WO 88/05218 A1 | 7/1988 |
| WO | WO 99/56352 A2 | 11/1999 |
| WO | WO 2004/059794 A2 | 7/2004 |
| WO | WO 2004/059801 A1 | 7/2004 |
| WO | WO 2006/002356 A1 | 1/2006 |
| WO | WO 2006/039277 A1 | 4/2006 |
| WO | WO 2007/005597 A2 | 1/2007 |
| WO | WO 2007/005599 A1 | 1/2007 |
| WO | WO 2008/072322 A1 | 6/2008 |
| WO | WO 2008/124057 A1 | 10/2008 |
| WO | WO 2010/039188 A1 | 4/2010 |
| WO | WO 2012/078434 A2 | 6/2012 |
| WO | WO 2013/006592 A2 | 1/2013 |
| WO | WO 2015/013430 A1 | 1/2015 |
| WO | WO 2015/112717 A1 | 7/2015 |

OTHER PUBLICATIONS

Chinese Office Action for Application No. CN201580069567.7 dated Oct. 9, 2019.
Extended European Search Report for European Application No. EP 11166820.8 dated Jan. 24, 2012.
International Preliminary Report on Patentability for International Application No. PCT/US2017/057402 dated May 2, 2019.
International Search Report and Written Opinion for International Application No. PCT/US2015/012463 dated May 13, 2015.
International Search Report and Written Opinion for International Application No. PCT/US2015/060472 dated Mar. 11, 2016.
International Search Report and Written Opinion for International Application No. PCT/US2015/012542 dated Apr. 30, 2015.
International Search Report and Written Opinion for International Application No. PCT/US2016/043358 dated Nov. 3, 2016.
International Search Report and Written Opinion for International Application No. PCT/US2017/033122 dated Aug. 8, 2017.
International Search Report and Written Opinion for International Application No. PCT/US2014/026381 dated Aug. 12, 2014.
International Search Report and Written Opinion for International Application No. PCT/US2017/057402 dated Jan. 19, 2018.
International Search Report and Written Opinion for International Application No. PCT/US2006/25562 dated Oct. 31, 2007.
International Search Report and Written Opinion for International Application No. PCT/US2005/034605 dated Jan. 26, 2006.
International Search Report and Written Opinion for International Application No. PCT/US2010/056482 dated Mar. 14, 2011.
International Search Report and Written Opinion for International Application No. PCT/US2011/026139 dated Nov. 22, 2011.
International Search Report and Written Opinion for International Application No. PCT/US2011/034747 dated Jul. 28, 2011.
International Search Report and Written Opinion for International Application No. PCT/US2012/023689 dated Sep. 12, 2012.
International Search Report and Written Opinion for International Application No. PCT/US2012/060610 dated Mar. 29, 2013.
International Search Report and Written Opinion for International Application No. PCT/US2010/056495 dated Jan. 25, 2011.
International Search Report and Written Opinion for International Application No. PCT/US2018/045207 dated Nov. 29, 2018.
[No Author Listed], Agilent. Designing Scalable 10G Backplane Interconnect Systems Utilizing Advanced Verification Methodologies. White Paper, Published May 5, 2012. 24 pages.
[No Author Listed], Amphenol TCS expands the Xcede Platform with 85 Ohm Connectors and High-Speed Cable Solutions. Press Release. Published Feb. 25, 2009. http://www.amphenol.com/about/news_archive/2009/58 [Retrieved on Mar. 26, 2019 from Wayback Machine]. 4 pages.
[No Author Listed], Carbon Nanotubes for Electromagnetic Interference Shielding. SBIR/STTR. Award Information. Program Year 2001. Fiscal Year 2001. Materials Research Institute, LLC. Chu et al. Available at http://sbir.gov/sbirsearch/detail/225895. Last accessed Sep. 19, 2013. 2 pages.
[No Author Listed], File:Wrt54gl-layout.jpg. Sep. 8, 2006. Retrieved from the Internet: https://xinu.mscs.mu.edu/File:Wrt54gl-layout.jpg [retrieved on Apr. 9, 2019]. 2 pages.
[No Author Listed], Hitachi Cable America Inc. Direct Attach Cables. 8 pages. Retrieved Aug. 10, 2017 from http://www.hca.hitachi-cable.com/products/hca/catalog/pdfs/direct-attach-cable-assemblies.pdf [last accessed Mar. 6, 2019].
[No Author Listed], Size 8 High Speed Quadrax and Differential Twinax Contacts for Use in MIL-DTL-38999 Special Subminiature Cylindrical and ARINC 600 Rectangular Connectors. Published May 2008. 10 pages. Retrieved from https://www.peigenesis.com/images/content/news/amphenol_quadrax.pdf.
Beaman, High Performance Mainframe Computer Cables. 1997 Electronic Components and Technology Conference. 1997;911-7.
Fjelstad, Flexible Circuit Technology. Third Edition. BR Publishing, Inc. Sep. 2006. 226 pages. ISBN 0-9667075-0-8.
Lloyd et al., High Speed Bypass Cable Assembly, U.S. Appl. No. 15/271,903, filed Sep. 21, 2016.
Lloyd et al., High Speed Bypass Cable Assembly, U.S. Appl. No. 15/715,939, filed Sep. 26, 2017.
Shi et al, Improving Signal Integrity in Circuit Boards by Incorporating Absorbing Materials. 2001 Proceedings. 51st Electronic Components and Technology Conference, Orlando FL. 2001:1451-56.
U.S. Appl. No. 16/897,641, filed Jun. 10, 2020, Provencher et al.
U.S. Appl. No. 16/133,388, filed Sep. 17, 2020, Gailus et al.

(56) References Cited

OTHER PUBLICATIONS

Serial No. CN 201580069567.7, dated Jun. 17, 2019, Chinese Office Action.
Serial No. CN 201580069567.7, dated Oct. 9, 2019, Chinese Office Action.
Serial No. EP 11166820.8, dated Jan. 24, 2012, Extended European Search Report.
Serial No. PCT/US2005/034605, dated Jan. 26, 2006, International Search Report and Written Opinion.
Serial No. PCT/US2006/025562, dated Oct. 31, 2007, International Search Report and Written Opinion.
Serial No. PCT/US2010/056482, dated Mar. 14, 2011, International Search Report and Written Opinion.

* cited by examiner

HIGH-FREQUENCY ELECTRICAL CONNECTOR

CROSS-REFERENCE TO RELATED APPLICATIONS

This application claims the benefit under 35 U.S.C. § 119(e) of U.S. Provisional Patent Application Ser. No. 62/770,462, filed on Nov. 21, 2018, entitled "HIGH-FREQUENCY ELECTRICAL CONNECTOR," which is hereby incorporated herein by reference in its entirety.

BACKGROUND

This disclosure relates generally to electrical interconnection systems and more specifically to improved signal integrity in interconnection systems, particularly in high speed electrical connectors.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughter boards" or "daughter cards," may be connected through the backplane.

A known backplane has the form of a printed circuit board onto which many connectors may be mounted. Conductive traces in the backplane may be electrically connected to signal conductors in the connectors so that signals may be routed between the connectors. Daughter cards may also have connectors mounted thereon. The connectors mounted on a daughter card may be plugged into the connectors mounted on the backplane. In this way, signals may be routed among the daughter cards through the backplane. The daughter cards may plug into the backplane at a right angle. The connectors used for these applications may therefore include a right angle bend and are often called "right angle connectors." Other known connectors include, but are not limited to, orthogonal midplane connectors and midplaneless direct attachment orthogonal connectors.

Connectors may also be used in other configurations for interconnecting printed circuit boards and for interconnecting other types of devices, such as cables, to printed circuit boards. Sometimes, one or more smaller printed circuit boards may be connected to another larger printed circuit board. In such a configuration, the larger printed circuit board may be called a "mother board" and the printed circuit boards connected to it may be called daughter boards. Also, boards of the same size or similar sizes may sometimes be aligned in parallel. Connectors used in these applications are often called "stacking connectors" or "mezzanine connectors."

Regardless of the exact application, electrical connector designs have been adapted to mirror trends in the electronics industry. Electronic systems generally have gotten smaller, faster, and functionally more complex. Because of these changes, the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

In a high density, high speed connector, electrical conductors may be so close to each other that there may be electrical interference between adjacent signal conductors. To reduce interference, and to otherwise provide desirable electrical properties, shield members are often placed between or around adjacent signal conductors. The shields may prevent signals carried on one conductor from creating "crosstalk" on another conductor. The shield may also impact the impedance of each conductor, which may further affect electrical properties.

Examples of shielding can be found in U.S. Pat. Nos. 4,632,476 and 4,806,107, which show connector designs in which shields are used between columns of signal contacts. These patents describe connectors in which the shields run parallel to the signal contacts through both the daughter board connector and the backplane connector. Cantilevered beams are used to make electrical contact between the shield and the backplane connectors. U.S. Pat. Nos. 5,433,617, 5,429,521, 5,429,520, and 5,433,618 show a similar arrangement, although the electrical connection between the backplane and shield is made with a spring type contact. Shields with torsional beam contacts are used in the connectors described in U.S. Pat. No. 6,299,438. Further shields are shown in U.S. Publication No. 2013/0109232.

Other connectors have the shield plate within only the daughter board connector. Examples of such connector designs can be found in U.S. Pat. Nos. 4,846,727, 4,975,084, 5,496,183, and 5,066,236. Another connector with shields only within the daughter board connector is shown in U.S. Pat. No. 5,484,310. U.S. Pat. No. 7,985,097 is a further example of a shielded connector.

Other techniques may be used to control the performance of a connector. For example, transmitting signals differentially may reduce crosstalk. Differential signals are carried on a pair of conductive paths, called a "differential pair." The voltage difference between the conductive paths represents the signal. In general, a differential pair is designed with preferential coupling between the conductive paths of the pair. For example, the two conductive paths of a differential pair may be arranged to run closer to each other than to adjacent signal paths in the connector. No shielding is desired between the conductive paths of the pair, but shielding may be used between differential pairs. Electrical connectors can be designed for differential signals as well as for single-ended signals. Examples of differential signal electrical connectors are shown in U.S. Pat. Nos. 6,293,827, 6,503,103, 6,776,659, 7,163,421, and 7,794,278.

In an interconnection system, such connectors are attached to printed circuit boards, one of which may serve as a backplanes for routing signals between the electrical connectors and for providing reference planes to which reference conductors in the connectors may be grounded. Typically the backplane is formed as a multi-layer assembly manufactured from stacks of dielectric sheets, sometimes called "prepreg". Some or all of the dielectric sheets may have a conductive film on one or both surfaces. Some of the conductive films may be patterned, using lithographic or laser printing techniques, to form conductive traces that are used to make interconnections between circuit boards, circuits and/or circuit elements. Others of the conductive films may be left substantially intact and may act as ground planes or power planes that supply the reference potentials. The dielectric sheets may be formed into an integral board structure such as by pressing the stacked dielectric sheets together under pressure.

To make electrical connections to the conductive traces or ground/power planes, holes may be drilled through the printed circuit board. These holes, or "vias", are filled or plated with metal such that a via is electrically connected to one or more of the conductive traces or planes through which it passes.

To attach connectors to the printed circuit board, contact pins or contact "tails" from the connectors may be inserted into the vias, with or without using solder. The vias are sized to accept the contact tails of the connector.

As in the case of the connectors that attach to the printed circuit boards, the electrical performance of printed circuit boards is at least partially dependent on the structures of the conductive traces, ground planes and vias formed in the printed circuit boards. Further, electrical performance issues become more acute as the density of signal conductors and the operating frequencies of the connectors increase. Such electrical performance issues may include, but are not limited to, crosstalk between closely-spaced signal conductors.

SUMMARY

In accordance with embodiments, an electrical connector comprises an insulative shell having a floor; a first plurality of contacts extending through the floor, wherein the first plurality of contacts are disposed in a plurality of columns; a second plurality of contacts extending through the floor, wherein the second plurality of contacts are interspersed with the first plurality of contacts within the plurality of columns; and a conductive member adjacent the floor. The conductive member comprises a first plurality of openings, wherein the first plurality of contacts extend through the openings of the first plurality of openings; a second plurality of openings, wherein the second plurality of contacts extend through the openings of the second plurality of openings; and a first plurality of tabs, extending into openings in the insulative shell.

In some embodiments, the first plurality of tabs are slidable in the openings in the insulative shell relative to the columns of contacts.

In some embodiments, each of the openings in the insulative shell has a pair of opposed slots; and each of the first plurality of tabs is inserted into the pair of opposed slots.

In some embodiments, the first plurality of contacts are disposed in a plurality of pairs; within each column of the plurality of columns, each pair of the plurality of pairs is disposed between two adjacent contacts of the second plurality of contacts.

In some embodiments, the conductive member reduces near end crosstalk between a first pair and a second pair diagonally adjacent to the first pair by at least 2 dB over the frequency range from 5 to 28 GHz.

In some embodiments, each of the second plurality of contacts comprises a mating contact portion and two contact tails, the mating contact portion comprises a contact surface, and each of the second plurality of contacts comprises a twisted region such that a line between the two contact tails is transverse to the contact surface.

In some embodiments, the line between the two contact tails is at an angle to the contact surface between 35 and 55 degrees.

In some embodiments, a first of the two adjacent second contacts is twisted in a first direction relative to the contact surface; and a second of the two adjacent second contacts is twisted in a second direction, opposite to the first direction, relative to the contact surface.

In some embodiments, the floor comprises a plurality of surface portions and a recessed portion, recessed relative to the surface portions; the plurality of surface portions extend through the first plurality of openings; and the conductive member is disposed within the recessed portion.

In some embodiments, the first plurality of contacts are disposed in a plurality of pairs; each of the plurality of pairs extends through a surface portion of the plurality of surface portions.

In some embodiments, the second plurality of contacts extend through the recessed portion.

In some embodiments, the first plurality of contacts and the second plurality of contacts comprise mating contact portions and contact tails; the floor comprises a first surface and an opposed second surface; the mating contact portions of the first plurality of contacts and the second plurality of contacts extend from the first surface; the contact tails of the first plurality of contacts and the second plurality of contacts extend from the second surface; and the recessed portion comprises a recess in the first surface.

In some embodiments, the conductive member also comprises a second plurality of tabs; and the second plurality of tabs press against the second plurality of contacts.

In some embodiments, the second plurality of contacts comprise first surfaces, facing a first direction, and opposing second surfaces; the second plurality of tabs press against the second plurality of contacts at the second surfaces.

In some embodiments, the second plurality of contacts comprise dimples that are concave in the second surfaces; the second plurality of tabs comprise tips; and the tips of the second plurality of tabs contact the second surfaces at the dimples.

In some embodiments, the tips of the second plurality of tabs are rounded such that the tips contact the dimples at at least two points.

In some embodiments, the second plurality of tabs are compliant beams and exert a spring force against the second surfaces, biasing the conductive member in a second direction normal to the second surfaces; the floor comprises a plurality of surface portions and a recessed portion, recessed relative to the surface portions; the plurality of surface portions extend through the first plurality of openings such that edges of the conductive member abut the surface portions so as to counter spring forces biasing the conductive member in the second direction.

In some embodiments, the first surfaces of the second plurality of contacts comprise a selective plating of gold.

In some embodiments, the second plurality of contacts comprises at least 16 contacts; and the conductive member electrically connects the at least 16 contacts.

In some embodiments, the first plurality of contacts comprise differential signal contacts; and the second plurality of contacts comprise ground contacts.

In some embodiments, the conductive member comprises a metal member.

In some embodiments, the metal member comprises a metal sheet with the openings of the first plurality of openings and the second plurality of openings and the tabs formed therein.

In accordance with further embodiments, a printed circuit board comprises a plurality of signal traces; a plurality of ground layers; and the electrical connector as mentioned above mounted to the printed circuit board, wherein the first plurality of contacts are connected to the signal traces; and the second plurality of contacts are connected to the ground layers.

In accordance with further embodiments, a conductive member comprises a conductive sheet with a first plurality of openings and a second plurality of openings, wherein the first plurality of openings are disposed in a plurality of columns, and the second plurality of openings are interspersed with the first plurality of openings within the plurality of columns; and a first plurality of tabs, disposed at edge of the conductive sheet and bendable at an angle relative to the conductive sheet.

In some embodiments, the conductive member also comprises a second plurality of tabs; and each of the second plurality of tabs is disposed in each of the second plurality of openings.

In some embodiments, each of the second plurality of tabs is a compliant beam.

In some embodiments, the second plurality of tabs comprise tips; and the tips of the second plurality of tabs are rounded.

In some embodiments, each column of the plurality of columns is offset in the column direction with respect to adjacent columns.

In accordance with further embodiments, a method of forming an electrical connector, the method comprises placing a conductive member adjacent to a floor of a shell of the electrical connector; inserting a first plurality of contacts through a first plurality of openings in the conductive member such that the first plurality of contacts are positioned in columns on the floor; and inserting a second plurality of contacts through a second plurality of openings in the conductive member such that the second plurality of contacts are positioned in the columns, wherein a first plurality of tabs of the conductive member extend into openings in the shell such that the conductive member are attached to the shell.

In some embodiments, a second plurality of tabs on the conductive member press against the second plurality of contacts such that the second plurality of contacts are electrically connected through the conductive member.

In some embodiments, forming the conductive member by stamping in a metal sheet the openings of the first plurality of openings and the second plurality of openings and the first plurality of tabs and the second plurality of tabs.

In some embodiments, the method further comprises plating a first surface of the second plurality of contacts with a noble metal; and inserting the second plurality of contacts comprises sliding each of the second plurality of tabs over a second surface of the second plurality of contacts.

In some embodiments, placing the conductive member adjacent to the floor of the shell comprises receiving portions of the shell within the first plurality of openings, wherein the portions of the shell electrically insulate the first plurality of contacts from the conductive member.

BRIEF DESCRIPTION OF DRAWINGS

For a better understanding of the disclosed technology, reference is made to the accompanying drawings, which are incorporated herein by reference and in which.

DETAILED DESCRIPTION

The inventors have recognized and appreciated that the operating speed of an electrical connector may be improved with a conductive member adapted to be mounted adjacent a floor in a connector housing. In one implementation, such a conductive member may be made by forming one or more cutouts in a sheet of conductive material. The cutouts may be arranged such that, when the conductive member is disposed across a mating interface of the connector, the conductive member is in electrical contact with at least some of the ground conductors in the connector, but not with any conductive elements adapted to be signal conductors. For example, the cutouts may be aligned with the signal conductors at the mating interface so that each signal conductor extends through a corresponding cutout without making electrical contact with the conductive member. Though, alternatively or additionally, such a conductive member may be integrated into the connector near the contact tails.

Such techniques may be used alone or in any suitable combination, examples of which are provided in the exemplary embodiments described below.

Figure 1:
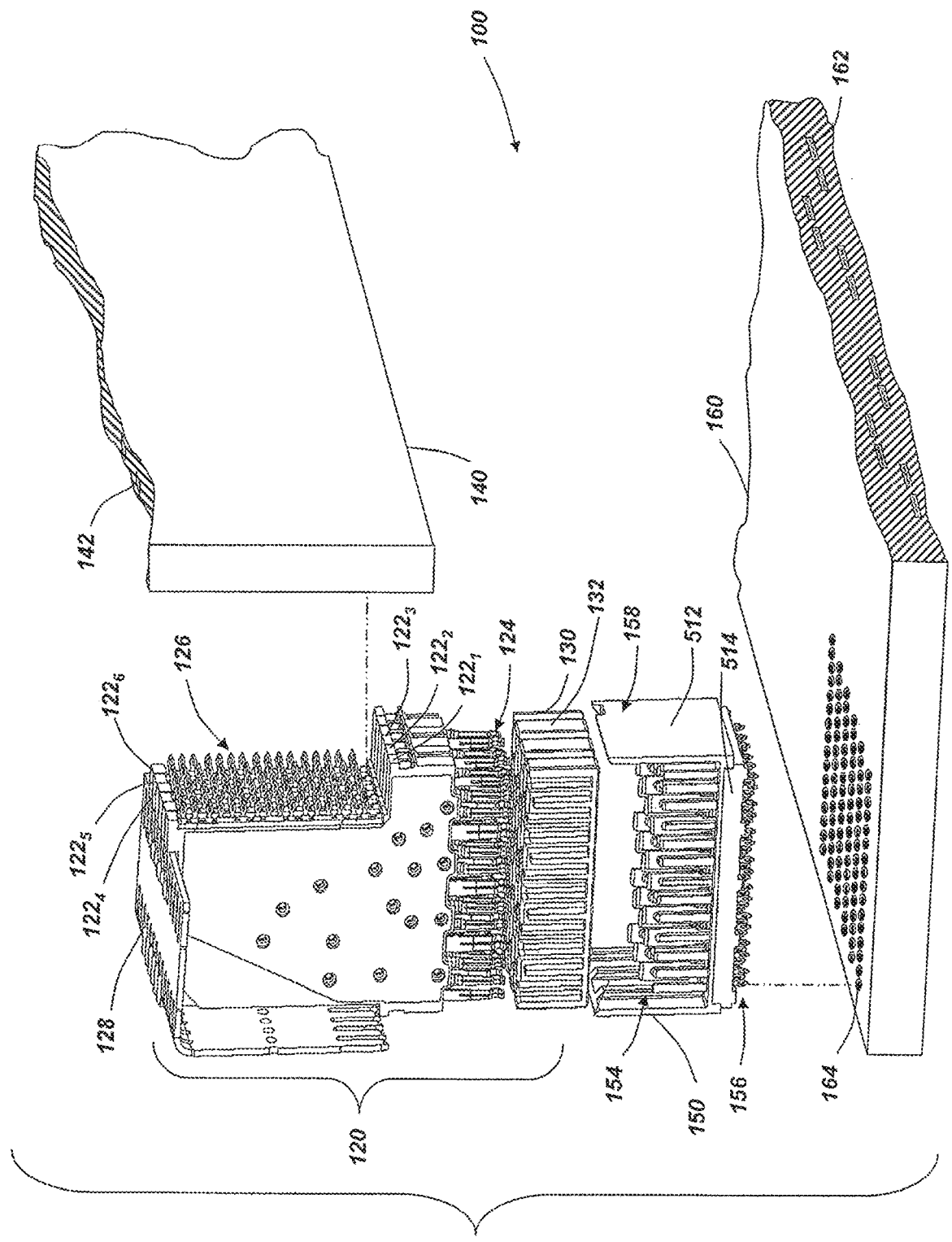
FIG. 1 is an exploded view of a high speed, high density electrical connector, a backplane and a daughter board.

Referring to FIG. 1, an electrical interconnection system 100 with two connectors is shown. The electrical interconnection system 100 includes a daughter card connector 120 and a backplane connector 150.

Daughter card connector 120 is designed to mate with backplane connector 150, creating electronically conducting paths between a backplane 160 and a daughter card 140. Though not expressly shown, interconnection system 100 may interconnect multiple daughter cards having similar daughter card connectors that mate to similar backplane connections on backplane 160. Accordingly, the number and type of subassemblies connected through an interconnection system is not a limitation.

FIG. 1 shows an interconnection system using a right-angle, separable mating interface connector. It should be appreciated that in other embodiments, the electrical interconnection system 100 may include other types and combinations of connectors, as the invention may be broadly applied in many types of electrical connectors, such as right-angle, separable mating interface connectors, mezzanine connectors and chip sockets.

Backplane connector 150 and daughter card connector 120 each contains conductive elements. The conductive elements of daughter card connector 120 are coupled to traces, of which trace 142 is numbered, ground planes or other conductive elements within daughter card 140. The traces carry electrical signals and the ground planes provide reference levels for components on daughter card 140. Ground planes may have voltages that are at earth ground or positive or negative with respect to earth ground, as any voltage level may act as a reference level.

Daughter card connector 120 includes a plurality of wafers 122$_1$ ... 122$_6$ coupled together, with each of the plurality of wafers 122$_1$ ... 122$_6$ having a housing and a column of conductive elements. In the illustrated embodiment, each column has a plurality of signal conductors and a plurality of ground conductors. The ground conductors may be employed within each wafer 122$_1$ ... 122$_6$ to minimize crosstalk between signal conductors or to otherwise control the electrical properties of the connector.

In the illustrated embodiment, daughter card connector 120 is a right angle connector and has conductive elements that traverse a right angle. As a result, opposing ends of the conductive elements extend from perpendicular edges of the wafers 122$_1$ ... 122$_6$.

Each conductive element of wafers 122$_1$ ... 122$_6$ has at least one contact tail, shown collectively as contact tails 126 that can be connected to daughter card 140. Each conductive element in daughter card connector 120 also has a mating contact portion, shown collectively as mating contact portions 124, which can be connected to a corresponding contact in backplane connector 150. Each conductive element also has an intermediate portion between the mating contact portion and the contact tail, which may be enclosed by or embedded within a wafer housing.

The contact tails 126 electrically connect the contacts within daughter card and connector 120 to conductive elements, such as traces 142 in daughter card 140. In the embodiment illustrated, contact tails 126 are press fit "eye of the needle" contacts that make an electrical connection through via holes in daughter card 140. However, any suitable attachment mechanism may be used instead of or in addition to via holes and press fit contact tails.

In the illustrated embodiment, each of the mating contact portions 124 has a dual beam structure configured to mate to a corresponding mating contact portion 154 of backplane connector 150. The conductive elements acting as signal conductors may be grouped in pairs, separated by ground conductors in a configuration suitable for use as a differential electrical connector. However, other embodiments are possible for single-ended use in which the conductive elements are evenly spaced with or without designated ground conductors separating signal conductors or with a ground conductor between signal conductors.

In the embodiments illustrated, some conductive elements are designated as forming a differential pair of conductors and some conductive elements are designated as ground conductors. These designations refer to the intended use of the conductive elements in an interconnection system as they would be understood by one skilled in the art. For example, though other uses of the conductive elements may be possible, differential pairs may be identified based on preferential coupling between the conductive elements that make up the pair. Electrical characteristics of the pair, such as its impedance, that make it suitable for carrying a differential signal may provide an alternative or additional method of identifying a differential pair. As another example, in a connector with differential pairs, ground conductors may be identified by their positioning relative to the differential pairs. In other instances, ground conductors may be identified by their shape or electrical characteristics. For example, ground conductors may be relatively wide to provide low inductance, which is desirable for providing a stable reference potential, but provides an impedance that is undesirable for carrying a high speed signal.

For exemplary purposes only, daughter card connector 120 is illustrated with six wafers 122$_1$ ... 122$_6$, with each wafer having a plurality of pairs of signal conductors and adjacent ground conductors. As pictured, each of the wafers 122$_1$ ... 122$_6$ includes one column of conductive elements. However, the disclosed technology is not limited in this regard, as the number of wafers and the number of signal conductors and ground conductors in each wafer may be varied as desired.

As shown, each wafer 122$_1$ ... 122$_6$ is inserted into front housing 130 such that mating contact portions 124 are inserted into and held within openings in front housing 130. The openings in front housing 130 are positioned so as to allow mating contact portions 154 of the backplane connector 150 to enter the openings in front housing 130 and allow electrical connection with mating contact portions 124 when daughter card connector 120 is mated to backplane connector 150.

Daughter card connector 120 may include a support member instead of or in addition to front housing 130 to hold wafers 122$_1$ ... 122$_6$. In the pictured embodiment, stiffener 128 supports the plurality of wafers 122$_1$ ... 122$_6$. Stiffener 128 is, in the embodiment illustrated, a stamped metal member. However, stiffener 128 may be formed from any suitable material. Stiffener 128 may be stamped with slots, holes, grooves or other features that can engage a wafer.

Similarly, contacts in backplane connector 150 are coupled to traces, of which trace 162 is numbered, ground planes or other conductive elements within backplane 160. When daughter card connector 120 and backplane connector 150 mate, contacts in the backplane connector and conductive elements in the daughter card connector mate to complete electrically conductive paths between the conductive elements within backplane 160 and daughter card 140.

Backplane connector 150 includes a backplane shell 158 and a plurality of contacts. The contacts of backplane connector 150 are held within the shell 158, which may be formed of an insulative material. In some embodiments, the contacts extend through floor 514 of the backplane shell 158 with portions both above and below floor 514. Here, the portions of the contacts that extend above floor 514 form mating contact portions, shown collectively as mating contact portions 154, which are adapted to mate to corresponding conductive elements of daughter card connector 120. In the illustrated embodiment, mating contact portions 154 are in the form of blades, although other suitable contact configurations may be employed, as the disclosed technology is not limited in this regard.

Tail portions, shown collectively as contact tails 156, of the contacts extend below the shell floor 514 and are adapted to be attached to backplane 160. Here, the tail portions are in the form of a press fit, "eye of the needle" compliant sections that fit within via holes, shown collectively as via holes 164, on backplane 160. However, other configurations are also suitable, such as surface mount elements, spring contacts, solderable pins, etc., as the disclosed technology is not limited in this regard.

Figure 2:
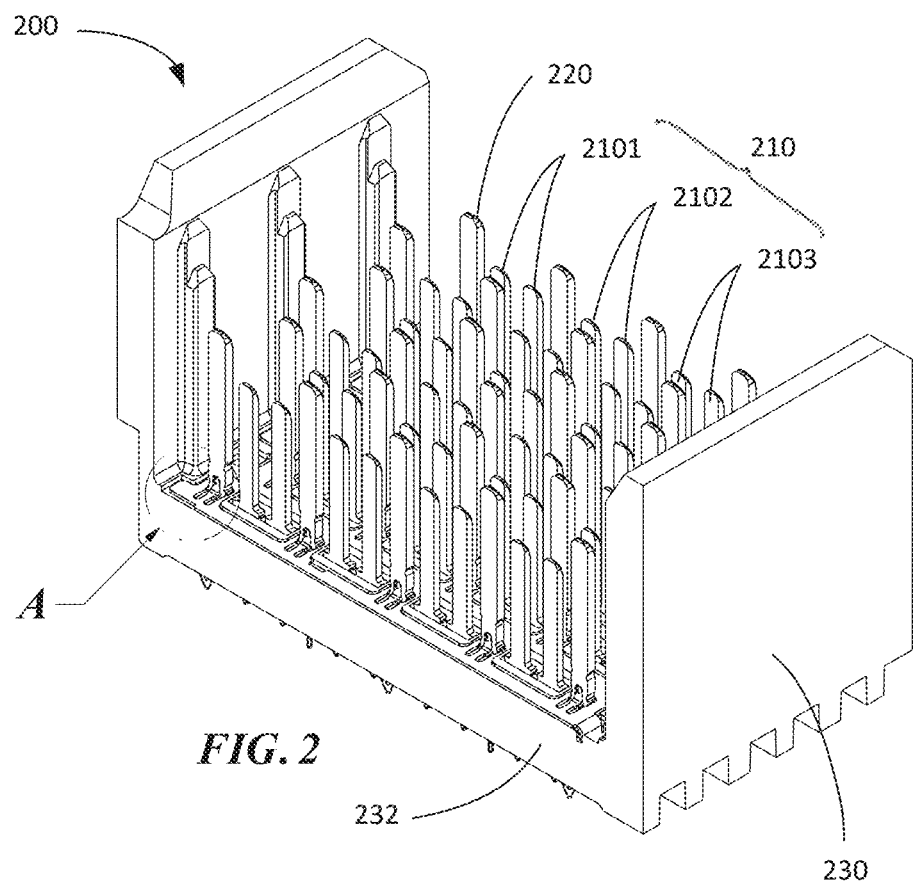
FIG. 2 is a perspective view of a backplane connector in accordance with a first embodiment of a high speed, high density electrical connector.

FIG. 2 shows a perspective view of a backplane connector 200 suitable for use with a daughter card connector (e.g., the daughter card connector 120 shown in FIG. 1), in accordance with some embodiments. In this example, the contacts in backplane connector 200 generally include a first plurality of contacts 210 and a second plurality of contacts 220, which are accommodated in an insulative shell 230. In some embodiments, the first contacts may be adapted to be signal conductors, while the second contacts may be adapted to be ground conductors. The first contacts 210 are disposed in a plurality of columns. For example, first contacts 2101, 2102 and 2103 are disposed in a column. The second contacts 220 are interspersed with the first contacts 210 within each column. In the illustrated embodiment, the first contacts 210 are disposed in a plurality of pairs, for example, for transmitting signals differentially. The adjacent pairs of the first contacts 210 within a column are separated by at least a second contact 220. For instance, within each column, each pair of the first contacts is disposed between and adjacent two second contacts. The pair of the first contacts 2101, the pair of the first contacts 2102 and the pair of the first contacts 2103 are disposed between and adjacent two second contacts 220 respectively. The ground conductors may be employed to reduce crosstalk between signal conductors or to otherwise control one or more electrical properties of the connector. The ground conductors may perform these functions based on their shape and/or position within the column of contacts within a wafer or position within an array of contacts formed when multiple wafers are arranged side-by-side.

While a connector with differential pairs is shown in figures for purposes of illustration, it should be appreciated that embodiments are possible for single-ended use in which contacts are evenly spaced without designated ground conductors separating designated differential pairs, or with designated ground conductors between adjacent designated signal conductors for some or all of the columns.

Figures 3, 3A:
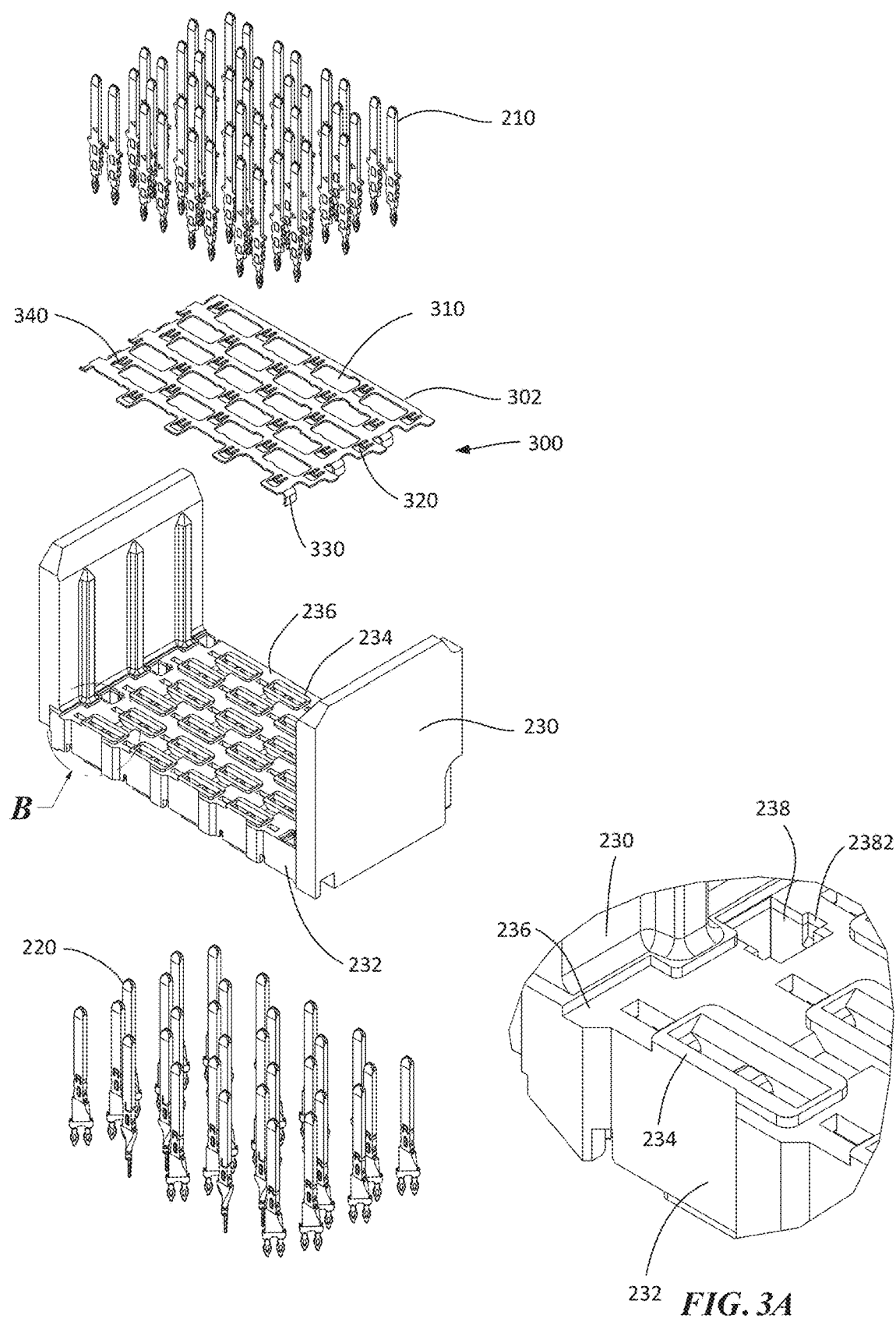
FIG. 3 is an exploded view of the backplane connector of FIG. 2.
FIG. 3A is an enlarged view of region B in FIG. 3.
Figures 4, 4A:
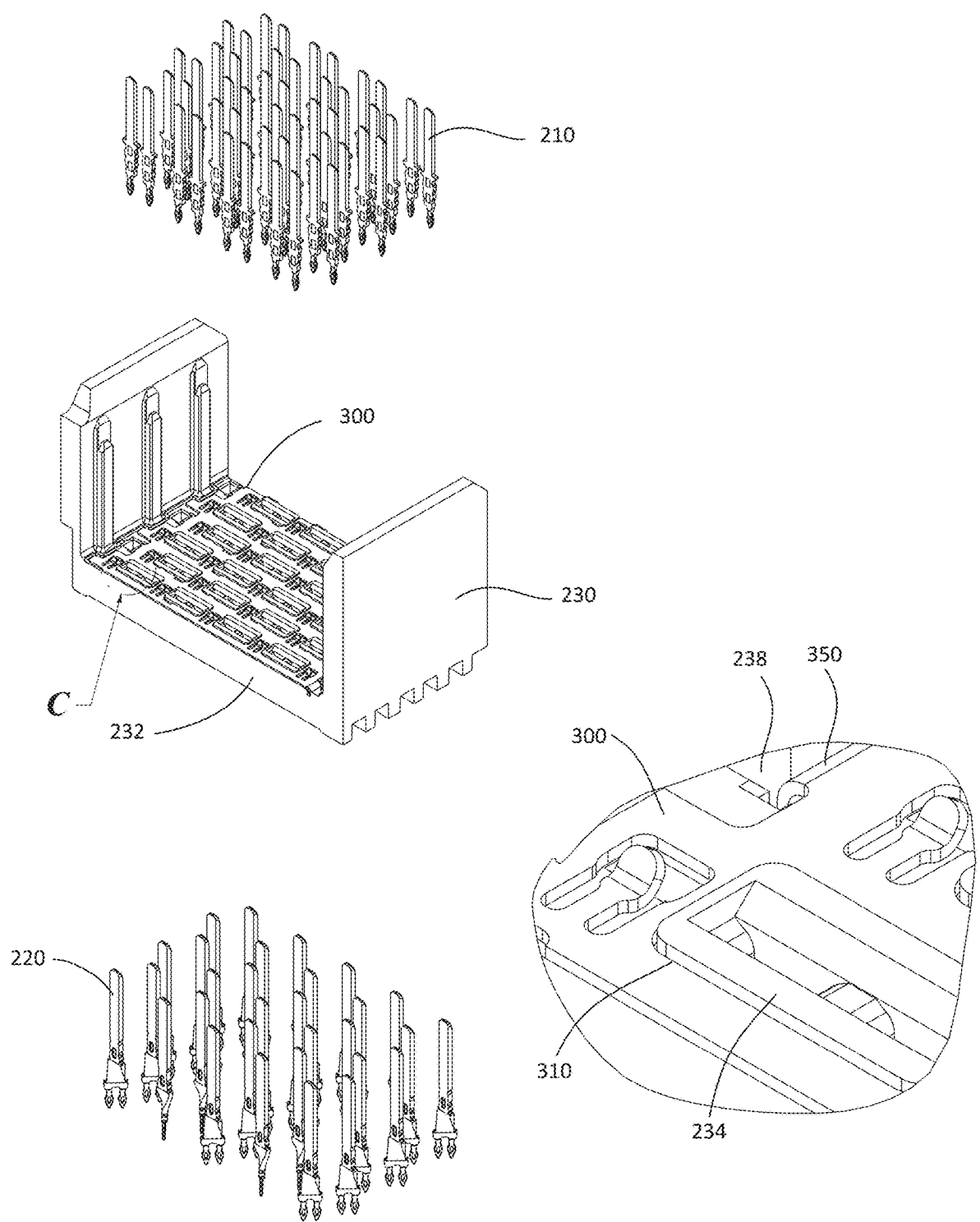
FIG. 4 an another exploded view of the backplane connector of FIG. 2, wherein a conductive member is attached to an insulative shell.
FIG. 4A is an enlarged view of region C in FIG. 4.

The backplane connector 200 further includes a conductive member 300, which is visible in the exploded view of FIG. 3. The conductive member 300 is disposed adjacent the floor 232 of the insulative shell 230, as shown in FIG. 4. The conductive member 300 comprises a first plurality of openings 310 and a second plurality of openings 320. For instance, the conductive member 300 may be a conductive sheet 302 with the first openings 310 and the second openings 320. In an assembled connector, the first contacts 210 extend through the first openings 310, and the second contacts 220 extend through the second openings 320. The mating contact portions of the first and second contacts 210 and 220 extend above the conductive member 300. The first openings 310 are arranged in a plurality of columns. The second openings 320 are interspersed with the first openings 310 within each column. For instance, the first and second openings 310 and 320 may be adapted to receive the mating contact portions of the first and second contacts 210 and 220 shown in FIG. 2, respectively. On the other hand, each of the first openings 310 may be adapted to receive two mating contact portions of two first contacts shown in FIG. 2, but without making electrical connection with either of the mating contact portions. In the illustrated embodiment, two first contacts 210 pass through each of first openings 310. Between any two adjacent first openings 310, there is a second opening 320. One second contact 220 passes through each of second openings 320. The second openings 320 may be adapted to make electrical connection between conductive member 300 and the mating contact portions of the second contacts. The connections, in some embodiments, may be made by sizing openings adapted to receive second contacts to be approximately the same size as the second contacts in one or more dimensions. However, it should be appreciated that aspects of the present disclosure are not limited to this.

Moreover, the second openings 320 may be shaped and positioned so that the conductive member 300 is in electrical contact with mating contact portions of second contacts 220, but not with mating contact portions of first contacts 210. In this manner, the second contacts 220 may be electrically connected to each other via the conductive member 300.

In some embodiments, each column of the first and second contacts 210 and 220 is offset in the column direction with respect to adjacent columns of the first and second contacts 210 and 220. Thus, the pairs of first contacts in a column are diagonally adjacent to the corresponding pairs of first contacts in adjacent columns. In the cases that the first contacts serve as signal conductors, even with diagonal pairs of signal conductors, the conductive member 300 can reduce crosstalk between them. Near End Crosstalk (NEXT), for example, may be reduced in this way. The conductive member 300 has an important benefit in reducing cross-talk at higher frequencies. The conductive member 300 can reduce crosstalk between diagonal pairs of signal conductors by at least 2 dB over the frequency range from 5 to 28 GHz.

In some embodiments, such a conductive member 300 may be formed by stamping a preform with appropriate patterns of openings and tabs (if any). Though, other materials may be used instead of or in addition to such a preform. A sheet of metal material, for example, may be used.

In some embodiments, the conductive member 300 further includes a first plurality of tabs 330, extending into openings 238 in the insulative shell 230, as shown in FIGS. 3-3A. In this way, the conductive member 300 is attached to the insulative shell 230. In example embodiments, the openings 238 are disposed in the floor 232 of the insulative shell 230, particularly, at the edge of the floor 232. The first tabs 330 may be disposed at an edge of the conductive sheet 302 and bendable at an angle relative to the conductive sheet 302.

In the embodiment illustrated in FIGS. 3 and 3A, the first tabs 330 are bent at an angle, such as about 90 degrees, relative to the conductive sheet 302. Each of the openings in the insulative shell 230 has a pair of opposed slots 2382. The first tabs 330 are inserted into the slots 2382 of corresponding opening 238. This both holds the conductive member 300 against the insulative shell 230 and sets the position of the conductive member 300 relative to the columns of contacts. In different embodiments, the angle of slots 2382 relative to horizontal direction may be different to accommodate first tabs 330 bent angle(s) other than 90 degrees.

Figure 5:
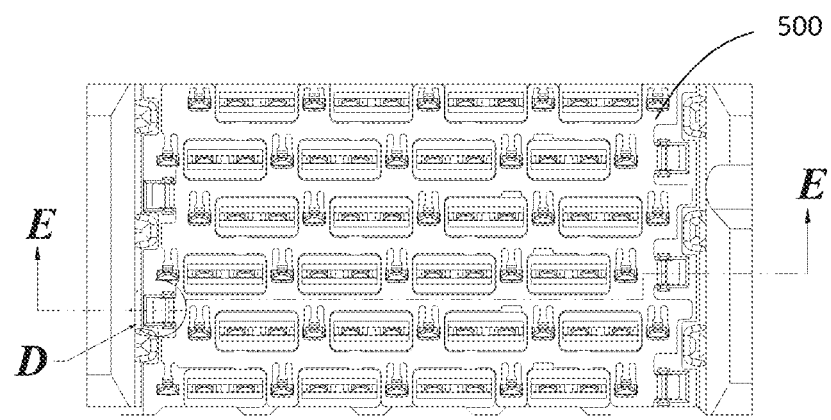
FIG. 5 is a top view of an insulative shell with a conductive member attached in accordance with second embodiment of a high speed, high density electrical connector.
Figure 5A:
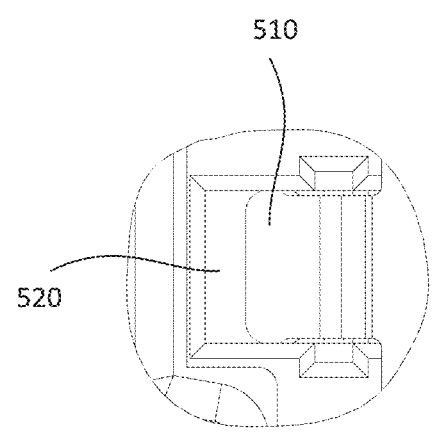
FIG. 5A is an enlarged view of region D in FIG. 5.
Figure 5B:
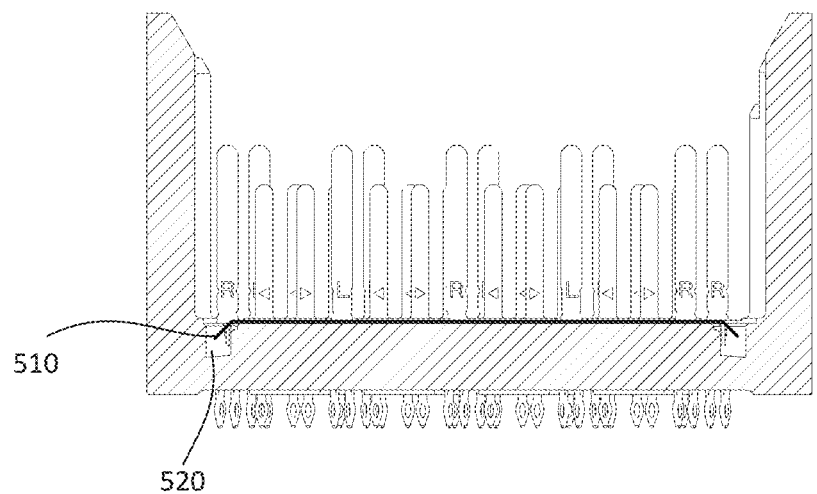
FIG. 5B is a sectional view taken along line E-E in FIG. 5.

In other embodiments illustrated in FIGS. 5 and 5A-5B, the first tabs 510 of the conductive member 500 are slidable in the openings 520 in the insulative shell 500. The openings 520 may have a configuration that is similar to or different from the opening 238 shown as FIGS. 3 and 3A. In the case that the opening 520 is similar to the opening 238, the first tabs 510 may be bent at less than 90 degrees. The first tab 510 are not inserted into the slots of the openings 520, instead, the sides of the first tabs 510 press against walls of larger openings 520, as shown in FIG. 5A. In this way, the first tab 510 is slidable in the opening 520. A benefit of this slidable connection is that the conductive member 500 is positioned relative to the columns of contacts based on the shape of the insulative shell 500 around the contacts. This avoids misalignment of the conductive member 500 relative to the contacts. It is found that misalignment of the conductive member 500 and contacts resulted in the conductive member 500 scraping along the edges of the contacts during assembly. This scraping caused metal to be scraped off the contact, which could interfere with operation of the connector.

Figure 2A:
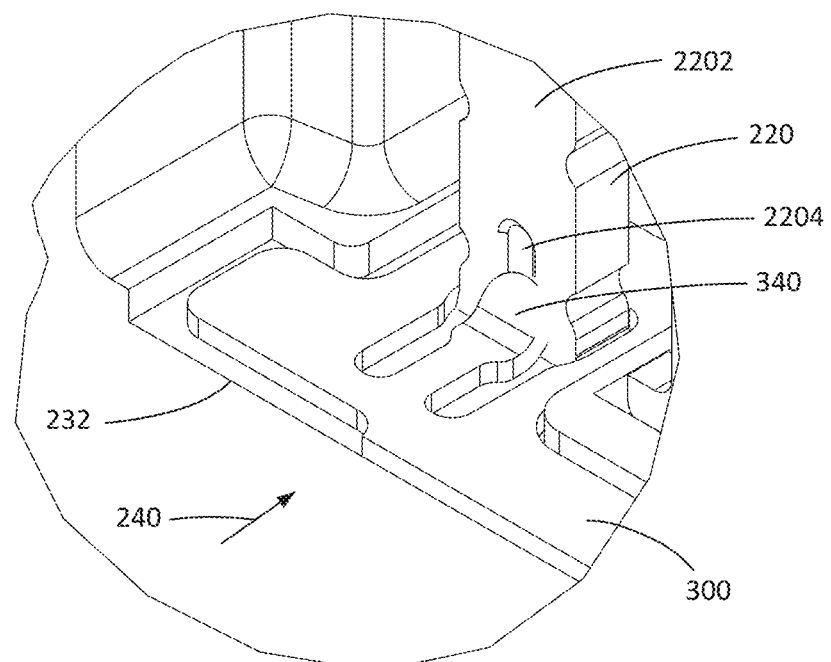
FIG. 2A is an enlarged view of region A in FIG. 2.

In some embodiments, the conductive member 300 further includes a second plurality of tabs 340, as shown in FIGS. 3 and 2A. Each of the second tabs 340 is disposed in each of the second openings 320. Each of the second tabs 340 presses against a corresponding second contact 220. The second contacts 220 may comprise first surfaces, facing a first direction, and opposing second surfaces 2202. In the embodiment illustrated, the second contacts 220 are shaped as blades with the first and second surfaces forming broadsides of the blades and edges joining the surfaces.

The second tabs 340 press against the second contacts 220 at the second surfaces 2202. In some embodiments, the second tabs 340 are compliant beams. The compliant beams exert a spring force against the second surfaces 2202, biasing the conductive member 300 in a second direction 240 normal to the second surfaces 2202. The first surfaces of the second contacts 220 may include mating surfaces of the second contacts 220 and may be selectively plated with a noble metal, such as gold. When daughter card connector 120 and backplane connector 150 mate, contacts in the backplane connector and conductive elements in the daughter card connector mate to complete electrically conductive paths at the first surfaces.

In some embodiments, the second tabs 340 may comprise tips, and the tips of the second tabs 340 are rounded. There are dimples 2204 that are concave in the second surfaces of the second contacts 220. The tips of the second tabs 340 can contact the second surfaces of the second contacts 220 at the dimples 2204. In this way, pressing the rounded tip of the second tab 340 into the dimple 2204 makes two or more points of contact between the second tab 340 and the second contact 220, such that the second tabs 340 can make good electrical contact with the second contacts 220. However, any suitable contacting mechanism may be used instead of or in addition to dimples 2204 and the rounded tip of the second tab 340. Thus, the above description is not a limitation.

As mentioned above, the second tabs 340 bias the conductive member 300 in the second direction 240. In order to counter this biasing force, the floor 232 of the insulative shell 230 comprises a plurality of surface portions 234 and a recessed portion 236, as shown in FIGS. 3-3A. The recessed portion 236 is recessed relative to the surface portions 234. The surface portions 234 extend through the first openings 310, as shown in FIG. 4A, and the conductive member 300 is disposed within the recessed portion 236. Accordingly, edges of the openings of the conductive member 300 abut the surface portions 234 so as to counter spring forces biasing the conductive member 300 in the second direction 240. In the embodiments in which the first contacts 210 are disposed in pairs, each pair of the first contacts 210 extends through a surface portion 234. The second contacts 220 extend through the recessed portion 236.

The floor 232 comprises a first surface, from which the mating contact portions of the first and second contacts 210 and 220 extend, and an opposed second surface, from which the contact tails of the first and second contacts 210 and 220 extend. In the example illustrated in the figures, the first surface corresponds to the upper surface of the floor 232, and the second surface corresponds to the lower surface of the floor 232. The recessed portion 236 comprises a recess in the first surface. In some embodiments, the conductive member 300 is recessed below the floor 232 of the shell. This positions the conductive member 300 by counters the forces exerted by the second tabs 340 against the second contacts 220. All second tabs 340 press the same direction, because the second tabs 340 should press on backs (second surfaces) of the second contacts 220. Fronts (first surfaces) of the second contacts 220 have the contact surface and are plated with gold. Gold would be scraped off if the second tabs 340 were to slide along the front as the second contacts 220 are inserted through the conductive member 300.

Figure 6:
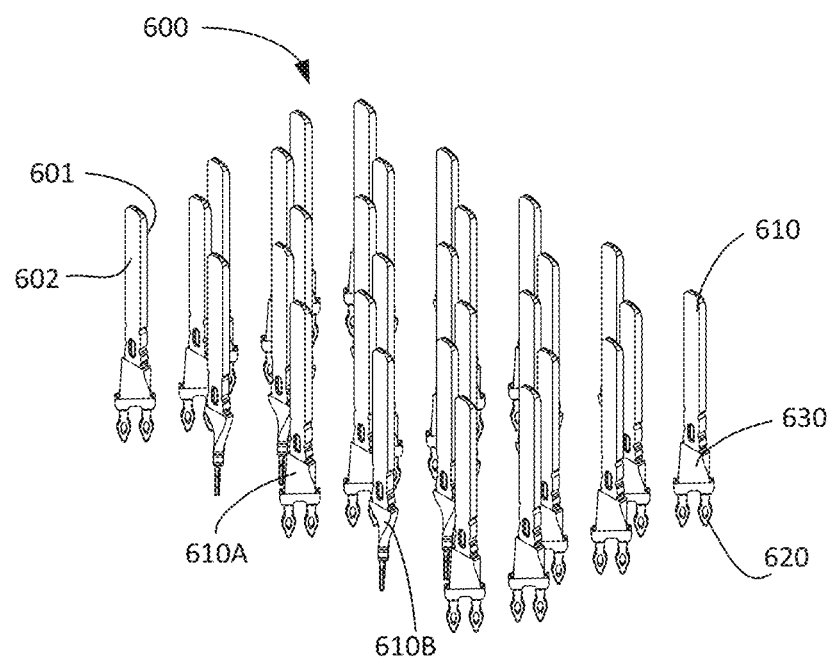
FIG. 6 is a perspective view of second contacts in accordance with a third embodiment of a high speed, high density electrical connector.

In some embodiments, each of the second contacts 600 comprises a mating contact portion 610 and two contact tails 620, as shown in FIG. 6. The dual beam contact tails are used to provide multiple points of contact between the second contacts and the backplane 160. Again, it should be appreciated that other numbers of contact tails and other types of mating contact portion structures may also be suitable for the second contacts 600. The second contact 600 has a first (front) surface 601 and an opposed second (back) surface 602, as mentioned above. The first surface 601 has the contact surface and is plated with gold, and the second surface 602 has a dimple. A second tab of the conductive member presses against the dimple.

In some embodiments, the second contacts 600 comprise twisted regions 630, which are connected between the mating contact portions 610 and contact tails 620. Because of the twisted region 630, a line between the two contact tails 620 is transverse to the contact surface. In some embodiments, the line between the two contact tails is at an angle to the contact surface between 35 and 55 degrees. This results in a via hole pattern in the backplane to which the connector is attached that reduces crosstalk. It especially reduces crosstalk between two pairs of vias carrying signals that are close to each other in a column.

In some embodiments, one of two adjacent second contacts is twisted in a first direction relative to the contact surface, and the other of the two adjacent contacts is twisted in a second direction, opposite to the first direction, relative to the contact surface. As shown in FIG. 6, take two adjacent second contacts 610A and 610B for example, the contact tails of the second contact 610A are twisted in counterclockwise direction relative to the contact surface, while the contact tails of the second contact 610B are twisted in clockwise direction relative to the contact surface. Accordingly, it seems that the contact tails of the second contacts 610A and 610B face to each other. This feature is provided to further reduce crosstalk between two pairs of signal conductors close to each other in a column.

Preferably, the connector comprises at least 16 second contacts, and the conductive member 300 electrically connects the at least 16 contacts as a common conductive member.

Any backplane connector mentioned above may be mounted to a printed circuit board. The printed circuit board further comprises a plurality of signal traces and a plurality of ground layers. The first contacts of backplane connector are connected to the signal traces, and the second contacts are connected to the ground layer.

The assembling of the electrical connector is described by reference to the embodiment as shown in FIGS. 4-4A. Firstly, the conductive member 300 is placed adjacent to the floor of the shell 230. The first tabs 350 of the conductive member 300 extend into openings 238 in the shell such that the conductive member 300 is attached to the shell 230. Then, the first contacts 210 are inserted through the first openings in the conductive member 300 and the floor 232 of first contacts 210, and the second contacts 220 are inserted through the second openings in the conductive member 300 and the floor 232 of first contacts 210. In this manner, the first and second contacts 210 and 220 are positioned in columns on the floor.

In this embodiment, the first tabs are bent down to engage the slots of shell. However, the manner by which the conductive member 300 is attached to the shell 230 is not limited to this. Alternatively or additionally, the conductive member 300 may be attached to the shell by an interference fit, and/or smaller first tabs 510 and larger openings 520 as shown in FIGS. 5-5A. The step of placing the conductive member adjacent to the floor of the shell comprises receiving portions of the shell within the first openings. For instance, a plurality of projecting surface portions 234 may extend into first openings 310, as shown in FIG. 3. The portions of the shell electrically insulate the first contacts from the conductive member. The second tabs may press against the second contacts such that the second contacts are electrically connected through the conductive member.

The step of inserting the second plurality of contacts comprises sliding each of the second tabs over a second surface of the second plurality of contacts, to avoid the noble metal on the opposed first surface to be scraped off.

Figure 7:
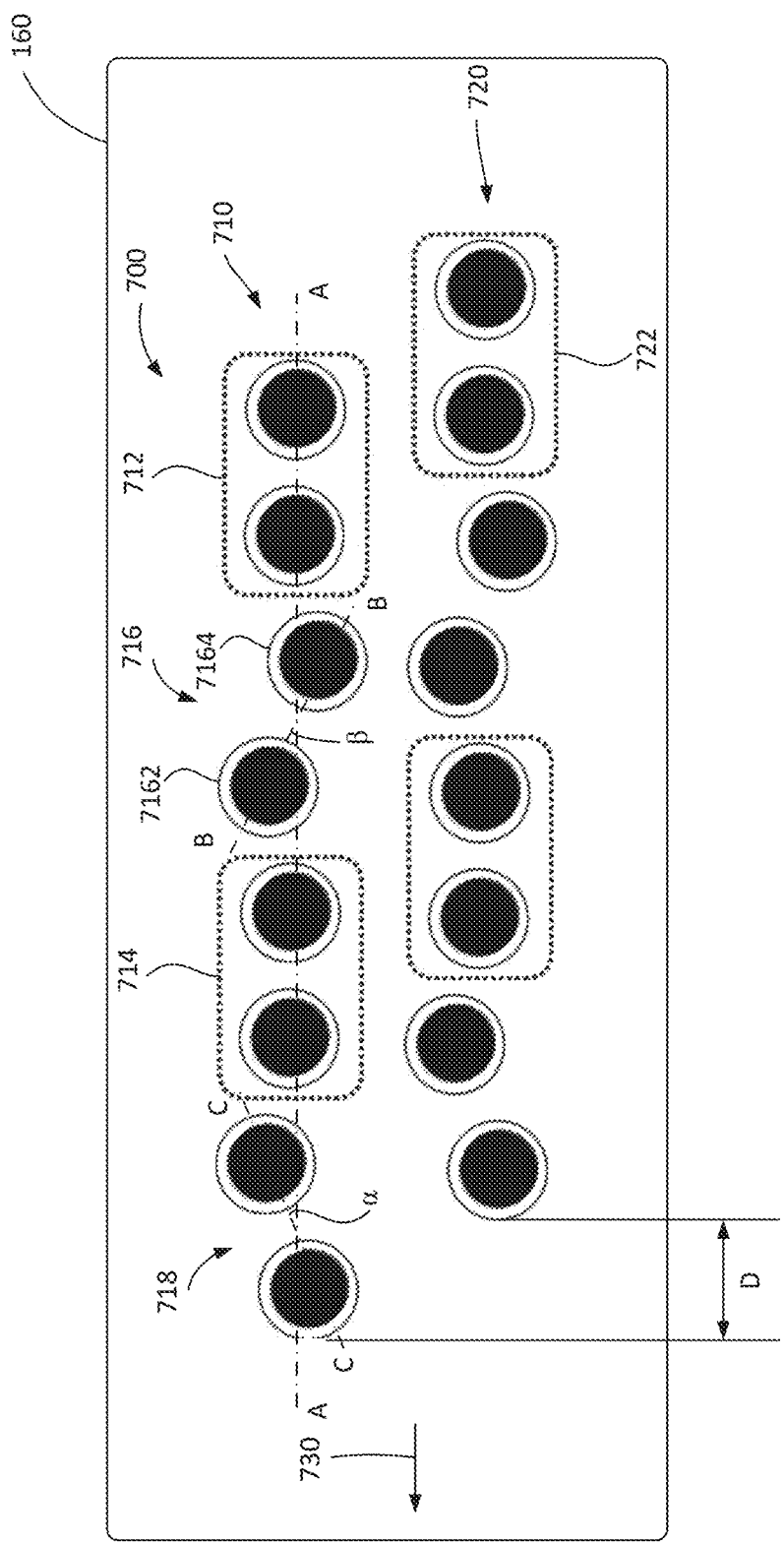
FIG. 7 is a partial top view of a connector footprint on a printed circuit board.

An example of a printed circuit board is described with reference to FIG. 7. A partial top view of backplane 160 showing a portion of a connector footprint 700 for mating with the contact tails of backplane connector 150 is shown in FIG. 7. The backplane 160 may be implemented as a printed circuit board as described below. As shown, the connector footprint 700 includes a plurality of columns of repeating via patterns. FIG. 7 only schematically shows two via patterns 710 and 720, and they are in different columns. In the illustrated embodiment, each via pattern includes two pairs of signal vias for forming two differential pair of signal conductors, and two pairs of ground vias for forming associated reference conductors. The via patterns 710 and 720 in adjacent columns may be offset by a distance D in a direction 730 of the columns such that Near End Crosstalk (NEXT) between adjacent pairs of signal vias, such as 712 and 722, in different columns can be reduced.

Take the via pattern 710 for example, it includes a first pair of signal vias 712 and a second pair of signal vias 714, as well as a first pair of ground vias 716 and a second pair of ground vias 718. Within each column, the pairs of ground vias are positioned between adjacent pairs of signal vias. The first pair of ground vias 716 is positioned between the first pair of signal vias 712 and the second pair of signal vias 714, and the second pair of ground vias 718 is positioned between the second pair of signal vias 714 and a first pair of signal vias in adjacent via pattern (not shown). Within each column, each pair of signal vias is positioned between a first pair of ground vias and a second pair of ground vias. The first pair of signal vias 712 is positioned between the first pair of ground vias 716 and a second pair of signal vias in adjacent via pattern (not shown), and the second pair of signal vias 714 is positioned between the second pair of ground vias 718 and the first pair of ground vias 716.

In some embodiments, the centers of the signal vias 712 and 714 are aligned on a first line A-A in the column direction 730. For each pair of ground vias, the centers of the ground vias have different offsets from the first line A-A in a direction perpendicular to the first line A-A. For instance, for the pair of first and second ground vias 7162 and 7164, the first and second ground vias 7162 and 7164 are offset from the first line in a direction perpendicular to the first line. Furthermore, the first and second ground vias 7162 and 7164 are offset from the first line in opposite directions. The first ground via 7162 is offset from the first line A-A upwards, and the second ground vias 7164 is offset from the first line A-A downwards, in FIG. 7.

The centers of the first pair of ground vias 716 are aligned on a second line B-B, and the centers of the second pair of ground vias 718 are aligned on a second line C-C. In some embodiments, the second line B-B makes an angle $\alpha$ with the first line A-A, and the second line C-C makes an angle $\beta$ with the first line A-A. In some embodiments, the angles $\alpha$ and $\beta$ are in the opposite directions. The absolute values of angles $\alpha$ and $\beta$ may be different or the same. These features are provided to reduce crosstalk between adjacent pairs of signal conductors in a column.

It will be understood that each of the via patterns 710 and 720 matches a pattern of contact tails of backplane connector 150, as shown in FIG. 1 and described above. In particular, each column of via patterns corresponds to one of the columns of contact tails of backplane connector 150. It will be understood that the parameters of the connector footprint may vary, including the number and arrangement of via patterns and the configuration of each via pattern, provided that the connector footprint matches the pattern of contact tails in backplane connector.

The disclosed technology is not limited in its application to the details of construction and the arrangement of components set forth in the following description or illustrated in the drawings. The disclosed technology is capable of other embodiments and of being practiced or of being carried out in various ways. Also, the phraseology and terminology used herein is for the purpose of description and should not be regarded as limiting. The use of "including," "comprising," "having," "containing," or "involving," and variations thereof herein, is meant to encompass the items listed thereafter and equivalents thereof as well as additional items.

Having thus described at least one illustrative embodiment of the invention, various alterations, modifications and improvements will readily occur to those skilled in the art.

For example, layers may be described as upper layers, or "above" or "below" other layers. It should be appreciated these terms are for ease of illustration and not a limitation on the orientation of layers. In the embodiment illustrated, "upper" refers to a surface of a printed circuit board to which components are attached or a normal to such a surface. In some embodiments, components may be attached to two sides of a printed circuit board, such that upper and lower may depend on which vias are being considered. Such alterations, modifications, and improvements are intended to be part of this disclosure, and are intended to be within the spirit and the scope of the present invention.

Further, it was described that each column of signal conductors within a connector may comprise pairs of signal conductors with one or more ground conductors between each pair. In some embodiments, the signal conductors and ground conductors may be arranged such that two ground conductors are between each pair of signal conductors. Such connectors may have a footprint with pairs of signal vias 712, 714 with multiple ground vias between each pair of signal vias, and, in some embodiments, with two pairs of ground vias 716, 718 between each pair of signal vias 714.

Accordingly, the foregoing description is by way of example only and is not intended to be limiting. The present invention is limited only as defined in the following claims and the equivalents thereto.

What is claimed is:

1. An electrical connector comprising:
an insulative shell having a floor;
a first plurality of contacts extending through the floor, wherein the first plurality of contacts are disposed in a plurality of columns;
a second plurality of contacts extending through the floor, wherein the second plurality of contacts are interspersed with the first plurality of contacts within the plurality of columns; and
a conductive member adjacent the floor, the conductive member comprising:
a first plurality of openings, wherein the first plurality of contacts extend through the openings of the first plurality of openings;

a second plurality of openings, wherein the second plurality of contacts extend through the openings of the second plurality of openings; and a first plurality of tabs, extending into openings in the insulative shell.

2. The electrical connector of claim 1, wherein:
the first plurality of tabs are slidable in the openings in the insulative shell relative to the columns of contacts.

3. The electrical connector of claim 1, wherein:
each of the openings in the insulative shell has a pair of opposed slots; and
each of the first plurality of tabs is inserted into the pair of opposed slots.

4. The electrical connector of claim 1, wherein:
the first plurality of contacts are disposed in a plurality of pairs;
within each column of the plurality of columns, each pair of the plurality of pairs is disposed between two adjacent contacts of the second plurality of contacts; and
the conductive member reduces near end crosstalk between a first pair and a second pair diagonally adjacent to the first pair by at least 2 dB over the frequency range from 5 to 28 GHz.

5. The electrical connector of claim 1, wherein:
the first plurality of contacts are disposed in a plurality of pairs;
within each column of the plurality of columns, each pair of the plurality of pairs is disposed between two adjacent contacts of the second plurality of contacts;
each of the second plurality of contacts comprises a mating contact portion and two contact tails, the mating contact portion comprises a contact surface, and
each of the second plurality of contacts comprises a twisted region such that a line between the two contact tails is transverse to the contact surface.

6. The electrical connector of claim 5, wherein:
the line between the two contact tails is at an angle to the contact surface between 35 and 55 degrees.

7. The electrical connector of claim 5, wherein:
a first of the two adjacent second contacts is twisted in a first direction relative to the contact surface; and
a second of the two adjacent second contacts is twisted in a second direction, opposite to the first direction, relative to the contact surface.

8. The electrical connector of claim 1, wherein:
the floor comprises a plurality of surface portions and a recessed portion, recessed relative to the surface portions;
the plurality of surface portions extend through the first plurality of openings; and
the conductive member is disposed within the recessed portion.

9. The electrical connector of claim 1, wherein:
the conductive member also comprises a second plurality of tabs;
the second plurality of tabs press against the second plurality of contacts;
the second plurality of contacts comprise first surfaces, facing a first direction, and opposing second surfaces; and
the second plurality of tabs press against the second plurality of contacts at the second surfaces.

10. The electrical connector of claim 9, wherein:
the second plurality of contacts comprise dimples that are concave in the second surfaces;
the second plurality of tabs comprise tips; and
the tips of the second plurality of tabs contact the second surfaces at the dimples.

11. The electrical connector of claim 10, wherein:
the tips of the second plurality of tabs are rounded such that the tips contact the dimples at at least two points.

12. The electrical connector of claim 9, wherein:
the second plurality of tabs are compliant beams and exert a spring force against the second surfaces, biasing the conductive member in a second direction normal to the second surfaces;
the floor comprises a plurality of surface portions and a recessed portion, recessed relative to the surface portions;
the plurality of surface portions extend through the first plurality of openings such that edges of the conductive member abut the surface portions so as to counter spring forces biasing the conductive member in the second direction.

13. The electrical connector of claim 9, wherein:
the first surfaces of the second plurality of contacts comprise a selective plating of gold.

14. The electrical connector of claim 1, wherein:
the second plurality of contacts comprises at least 16 contacts; and
the conductive member electrically connects the at least 16 contacts;
the first plurality of contacts comprise differential signal contacts; and
the second plurality of contacts comprise ground contacts.

15. The electrical connector of claim 1, in combination with a printed circuit board, the printed circuit board comprising:
a plurality of signal traces;
a plurality of ground layers; and
wherein the electrical connector is mounted to the printed circuit board, wherein:
the first plurality of contacts are connected to the signal traces; and
the second plurality of contacts are connected to the ground layers.

* * * * *